United States Patent
Katsuoka et al.

(10) Patent No.: US 7,368,016 B2
(45) Date of Patent: *May 6, 2008

(54) SUBSTRATE PROCESSING UNIT AND SUBSTRATE PROCESSING APPARATUS

(75) Inventors: Seiji Katsuoka, Tokyo (JP); Masahiko Sekimoto, Tokyo (JP); Teruyuki Watanabe, Tokyo (JP); Ryo Kato, Tokyo (JP); Toshio Yokoyama, Tokyo (JP); Kenichi Suzuki, Tokyo (JP); Kenichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/115,214

(22) Filed: Apr. 27, 2005

(65) Prior Publication Data

US 2005/0281947 A1    Dec. 22, 2005

(30) Foreign Application Priority Data

Apr. 28, 2004 (JP) ............................. 2004-132529
Jan. 27, 2005 (JP) ............................. 2005-020346

(51) Int. Cl.
*B05B 15/04* (2006.01)
*B05B 7/06* (2006.01)
*B05C 3/00* (2006.01)
*B05C 13/02* (2006.01)
*B08B 3/00* (2006.01)
*B08B 3/02* (2006.01)

(52) U.S. Cl. ............... 118/326; 118/313; 118/501; 118/423; 118/429; 134/199; 134/200; 134/94.1; 134/148

(58) Field of Classification Search ............... 118/326, 118/52, 612, 319, 320, 429, 423, 73, 500, 118/501, 313, 663, 666, 667, 688, 689, 692; 134/31–34, 902, 148, 153, 198, 94.1, 95.1, 134/200, 104.1, 199; 204/275.1, 267; 427/424, 427/427.1, 430.1

See application file for complete search history.

(56) References Cited

U.S. PATENT DOCUMENTS

| | | | |
|---|---|---|---|
| 3,727,620 A * | 4/1973 | Orr | 134/95.2 |
| 4,409,082 A | 10/1983 | Goldmann | |
| 6,019,843 A * | 2/2000 | Park et al. | 118/52 |
| 6,033,135 A * | 3/2000 | An et al. | 396/611 |
| 6,352,623 B1 | 3/2002 | Volodarsky et al. | |
| 6,379,520 B1 | 4/2002 | Kuriyama et al. | |
| 6,543,156 B2 * | 4/2003 | Bergman et al. | 34/410 |

(Continued)

FOREIGN PATENT DOCUMENTS

JP    57-210998    12/1982

(Continued)

*Primary Examiner*—Yewebdar Tadesse
(74) *Attorney, Agent, or Firm*—Wenderoth, Lind & Ponack, L.L.P.

(57) ABSTRACT

A substrate processing unit includes: a vertically-movable substrate holder for holding a substrate; a pan surrounding a periphery of the substrate holder; a cell, located below the substrate holder and within the pan, having in its interior a chemical processing section; and a cell cover, capable of closing a top opening of the cell, having a plurality of spray nozzles for separately spraying at least two types of processing liquids, wherein the pan and the cell each have an individual liquid discharge line.

5 Claims, 16 Drawing Sheets

U.S. PATENT DOCUMENTS

| | | | |
|---|---|---|---|
| 6,716,329 B2 * | 4/2004 | Okase et al. | 205/81 |
| 6,824,613 B2 | 11/2004 | Dai et al. | |
| 7,235,135 B2 * | 6/2007 | Miyazaki et al. | 118/423 |
| 2004/0040131 A1 | 3/2004 | Miyazaki et al. | |
| 2004/0226816 A1 | 11/2004 | Yamamuro | |
| 2005/0022909 A1 | 2/2005 | Wang et al. | |
| 2005/0072358 A1 * | 4/2005 | Katsuoka et al. | 118/719 |
| 2005/0158478 A1 | 7/2005 | Katsuoka et al. | |

FOREIGN PATENT DOCUMENTS

| | | |
|---|---|---|
| JP | 2000-160399 | 6/2000 |
| JP | 2002-299306 | 10/2002 |
| JP | 2003-273056 | 9/2003 |
| JP | 2004-300576 | 10/2004 |
| JP | 2004-339534 | 12/2004 |

* cited by examiner

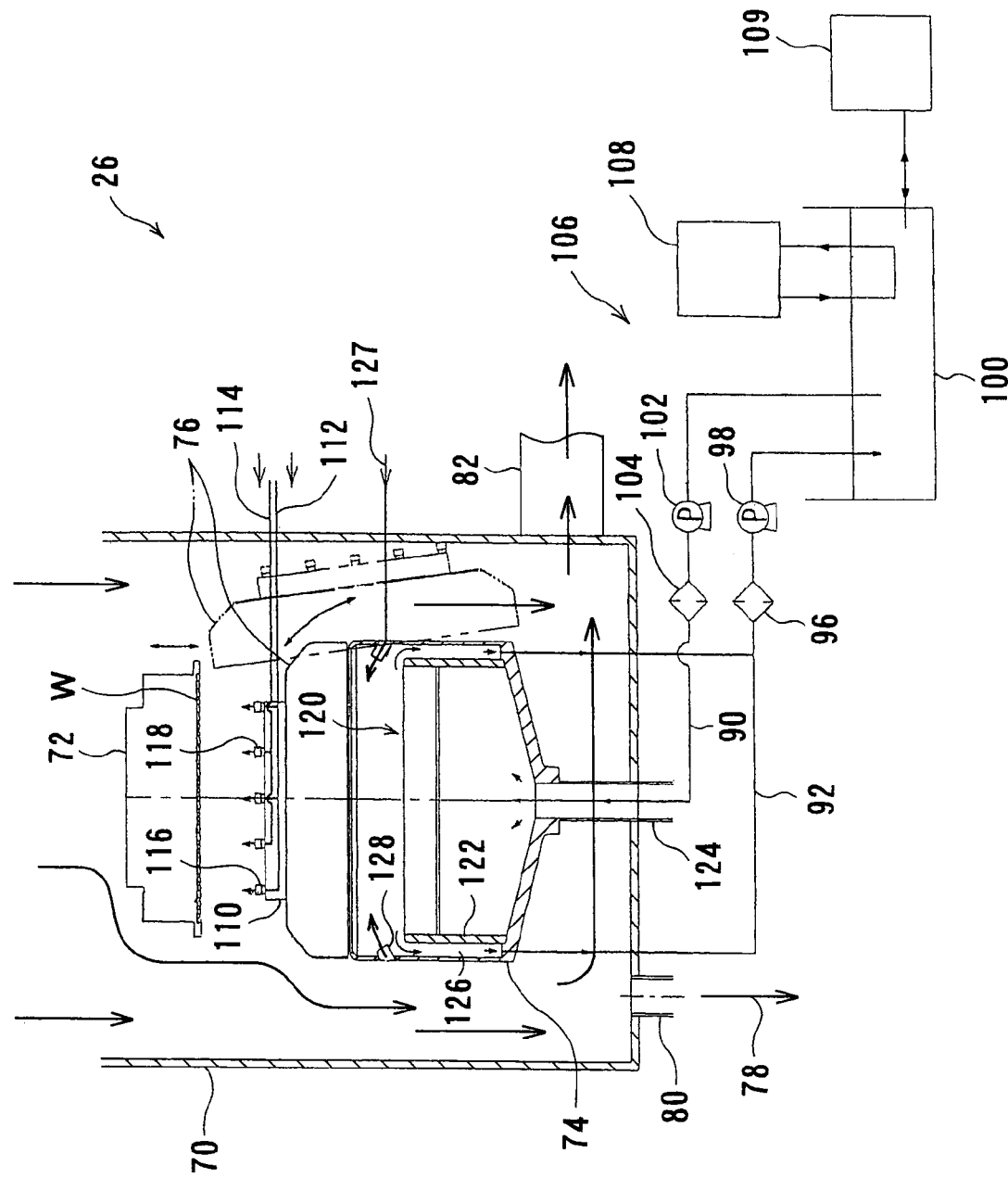

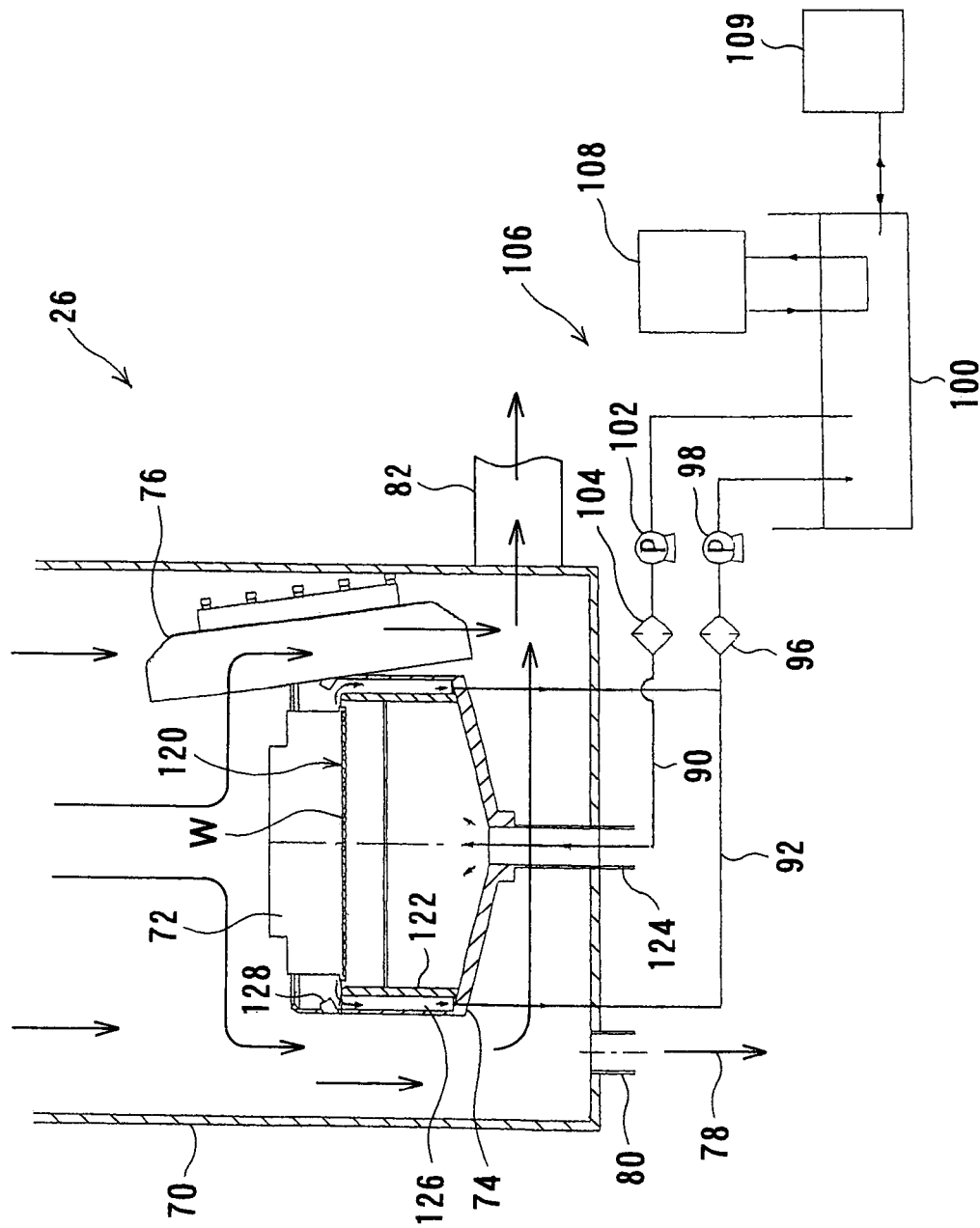

F I G. 1 2
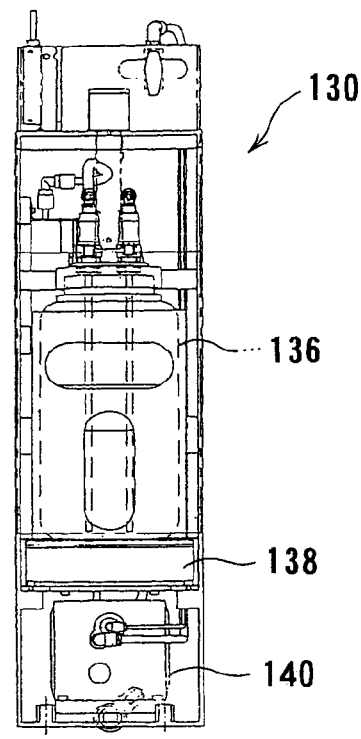
F I G. 1 3
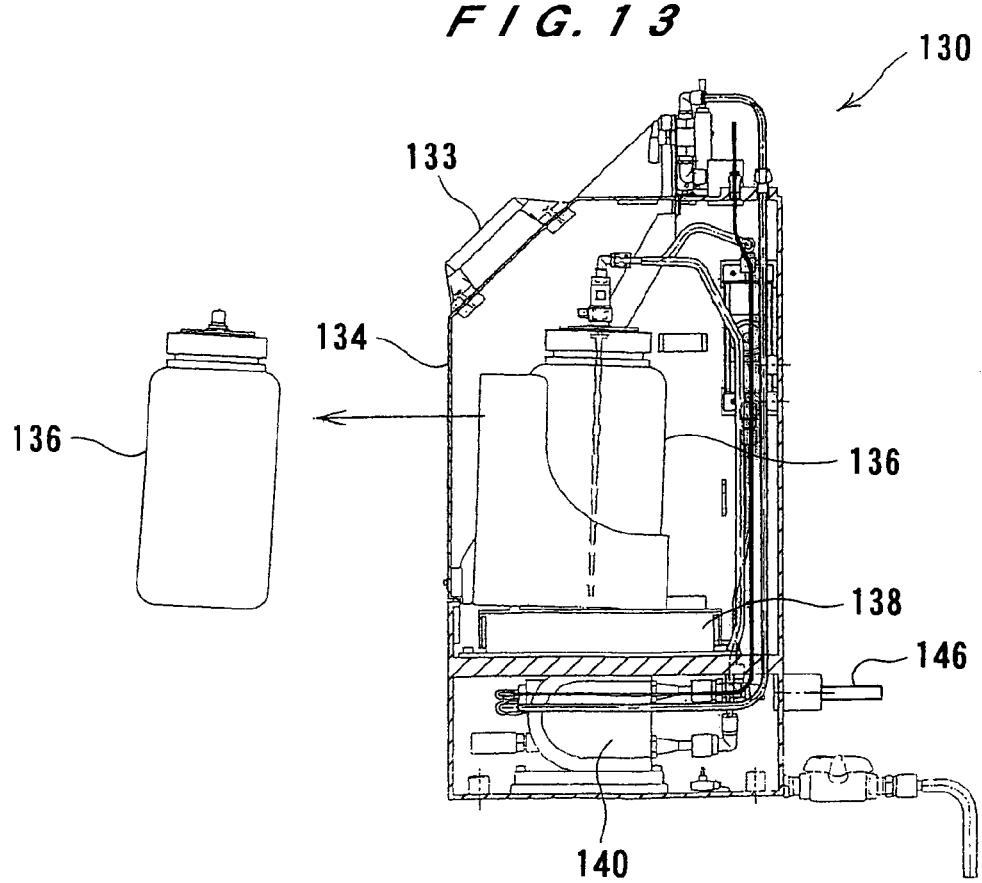

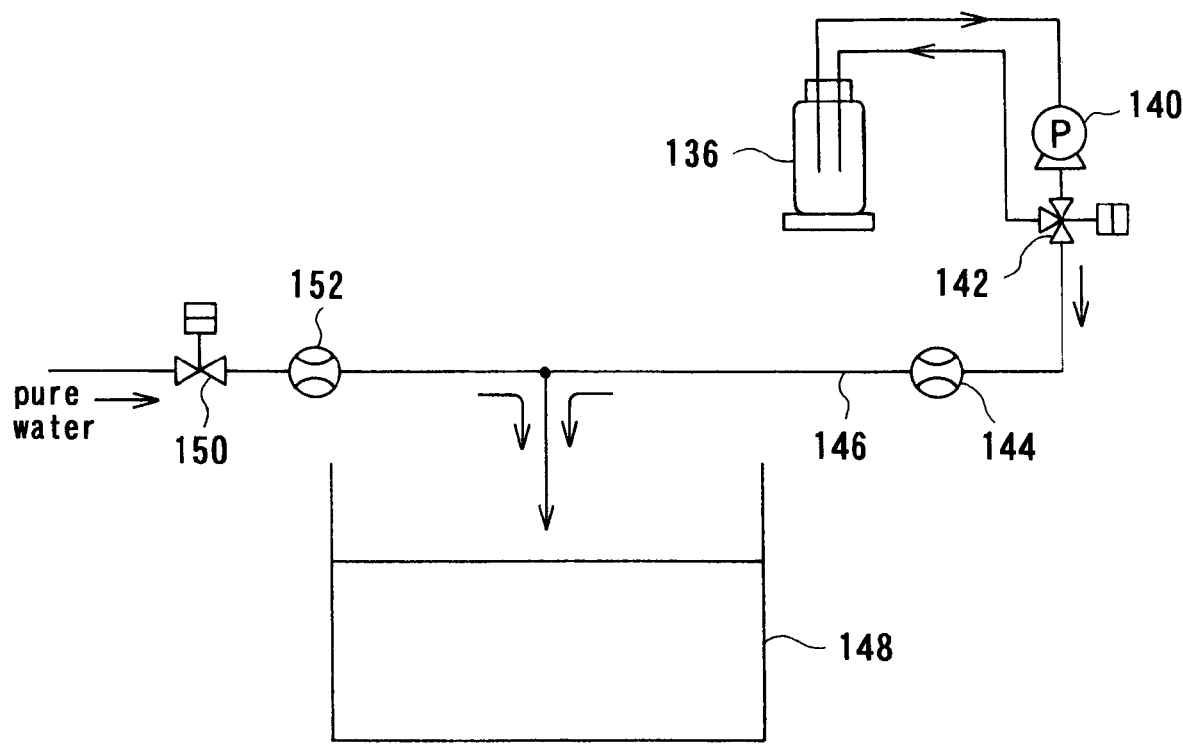
F I G. 1 5

SUBSTRATE PROCESSING UNIT AND SUBSTRATE PROCESSING APPARATUS

BACKGROUND OF THE INVENTION

1. Field of the Invention

The present invention relates to a substrate processing unit and a substrate processing apparatus, and more particularly to a substrate processing unit and a substrate processing apparatus which are useful for forming a protective film, for example, by electroless plating, on exposed surfaces of embedded interconnects of a conductive material (interconnect material), such as copper or silver, embedded in fine interconnect recesses provided in a surface of a substrate, such as a semiconductor wafer.

The present invention also relates to a substrate holding apparatus and a substrate holding method which can be advantageously used in processing a surface (processing surface) of a substrate with a plating solution or other processing liquid.

2. Description of the Related Art

As a process for forming interconnects in a semiconductor device, a so-called "damascene process", which comprises embedding a metal (conductive material) into trenches and contact holes, is coming into practical use. According to this process, aluminum, or more recently a metal such as silver or copper, is embedded into trenches and contact holes previously formed in an interlevel dielectric film. Thereafter, an extra metal is removed by performing chemical-mechanical polishing (CMP) so as to flatten a surface.

In a case of interconnects formed by such a process, for example copper interconnects formed by using copper as an interconnect material, embedded interconnects of copper have exposed surfaces after flattening processing. In order to prevent thermal diffusion of such interconnects (copper), or to prevent oxidation of such interconnects (copper) e.g. during forming thereon an insulating film (oxide film) under an oxidizing atmosphere to produce a semiconductor device having a multi-level interconnect structure, it is now under study to selectively cover exposed surfaces of interconnects with a protective film (cap material) composed of a Co alloy, a Ni alloy or the like so as to prevent thermal diffusion and oxidation of the interconnects. Such a Co alloy, a Ni alloy or the like can be produced e.g. by performing electroless plating.

As shown in FIG. 1, for example, trenches 4 as fine interconnect recesses are formed in an insulating film (interlevel dielectric film) 2 of $SiO_2$, low-k material film or the like which has been deposited on a surface of a substrate W, such as a semiconductor wafer. A barrier layer 6 of TaN or the like is formed on an entire surface, and then copper plating, for example, is performed on the surface of the substrate W to fill the trenches 4 with copper and deposit copper film on the surface of the substrate W. Thereafter, CMP (chemical-mechanical polishing) is performed on the surface of the substrate W so as to flatten the surface, thereby forming interconnects 8 composed of a copper film in the insulating film 2. Thereafter, a protective film (cap material) 9 composed of a CoWP alloy film is formed e.g. by electroless plating selectively on surfaces of interconnects (copper) 8 to protect interconnects 8.

A common electroless plating method for selective formation of the protective film (cap material) 9 of the CoWP alloy film on the surfaces of interconnects 8 generally involves the following process steps. First, substrate W such as a semiconductor wafer, which has undergone a CMP process, is immersed in an acid solution e.g. of 0.5M $H_2SO_4$ at a solution temperature of e.g. 25° C. for e.g. one minute to remove CMP residue, such as copper, remaining on a surface of an insulating film 2. After cleaning (rinsing) a surface of the substrate W with a cleaning liquid such as pure water, the substrate W is immersed in a mixed solution, e.g. of $PdCl_2$ and $H_2SO_4$, for e.g. one minute to adhere Pd as a catalyst to surfaces of interconnects 8, thereby activating exposed surfaces of interconnects 8.

Next, after cleaning (rinsing) the surface of the substrate W with a cleaning liquid such as pure water, the substrate W is immersed in a solution containing e.g. 20 g/L of $Na_3C_6H_5O_7 \cdot 2H_2O$ (sodium citrate) at a solution temperature of e.g. 25° C., thereby performing a neutralization treatment of the surfaces of interconnects 8. Then, after cleaning (rinsing) the surface of the substrate W with e.g. pure water, the substrate W is immersed in a CoWP plating solution at a solution temperature of e.g. 80° C. for e.g. 120 seconds, thereby performing selective electroless plating (electroless CoWP cap plating) on activated surfaces of interconnects 8. Thereafter, the surface of the substrate W is cleaned with a cleaning liquid such as ultrapure water. The protective film 9 composed of a CoWP alloy film is thus formed selectively on the surfaces of interconnects 8 to protect interconnects 8.

As described above, when forming a protective film (cap material) composed of a CoWP alloy by electroless plating, a catalyst-application processing for applying a catalyst, for example Pd, to surfaces of interconnects is performed in advance. Further, removal of CMP residue, e.g. copper, remaining on an insulating film, which processing is necessary for preventing a protective film from being formed on the insulating film, is performed usually by using an inorganic acid, such as $H_2SO_4$ or HCl. On the other hand, an electroless plating solution is generally an alkaline solution. Accordingly, it is necessary to perform a neutralization step immediately before plating to stabilize a plating process, whereby processes are increased and a number of processing tanks in respective processes is increased. As a result, not only throughput is lowered, but also process control between the processes is complicated. Furthermore, the apparatus has an increased size and occupies a wide installation space in a clean room, leading to an increased cost of the clean room.

This is because though use of a single processing unit to perform different processings with different processing liquids can reduce a space for performing an entire process of substrate processing, and can also reduce energy necessary for substrate transportation, it is difficult to avoid mixing or dilution of different processing liquids when a single processing unit is employed for performing different processings using the different processing liquids.

On the other hand, a dip processing method, which involves immersing a substrate in a processing liquid to bring a surface (processing surface) of the substrate into contact with the processing liquid, has conventionally been employed for performing stable and uniform plating (e.g. electroless plating) of the substrate or stable and uniform pre-plating processing, cleaning or the like of the substrate. A substrate processing unit, adapted for the dip processing method, is generally provided with a substrate holding apparatus for holding a substrate while sealing a peripheral portion of a front surface of the substrate, so that when the substrate, held by the substrate holding apparatus, is immersed in a processing liquid for processing of the substrate, the processing liquid is prevented from intruding into a peripheral portion of the front surface and also into a back surface of the substrate.

A substrate holding apparatus, which employs a so-called vacuum attraction method, has been developed. Such a substrate holding apparatus includes a continuous, ring-shaped attracting seal (annular seal) composed of an elastic material such as a rubber, and presses this attraction seal against a substrate so as to bring an end surface of the attracting seal into tight contact with a peripheral portion of a back surface of the substrate over an entire circumference, and attracts and holds the substrate while sealing the peripheral portion of the back surface of the substrate in a ring shape with the attraction seal by vacuuming an interior of the attraction seal.

It is important for a substrate holding apparatus to be capable of completely releasing a substrate from a head without any load after processing. A conventional method, widely practiced in a substrate holding apparatus adapted for the above-described vacuum attraction method, for example, involves introducing a clean gas, such as $N_2$ gas, into an attracting seal (annular seal) and jetting the gas toward a substrate, thereby releasing the substrate. In some cases, however, a substrate strongly sticking to an attracting seal, such as a rubber, cannot be released only by introduction of clean gas, such as $N_2$ gas. A method is therefore employed to introduce pure water, together with a clean gas, into an attracting seal and jet them toward a substrate simultaneously, thereby securely releasing the substrate even when the substrate is strongly sticking to the attracting seal, which is of a material such as a rubber.

However, when employing a method involving simultaneous jetting of clean gas and pure water, e.g. in a substrate holding apparatus adapted for the vacuum attraction method, two circuits for introductions of a clean gas and of pure water are necessary in addition to a circuit for vacuuming, leading to a complicated circuit construction and an increased size of apparatus.

In performing processing, such as electroless plating, of a substrate while holding the substrate with a substrate holding apparatus, it is desirable to hold the substrate with a weakest possible force and uniformly over an entire surface so as not to cause deformation of the substrate, thereby ensuring accuracy of processing. In order to securely prevent release or fall of a substrate during a series of processings, however, the substrate is attracted or mechanically held by a substrate holding apparatus with a certain degree of holding force which would not cause release or fall of the substrate even when the substrate is rotated generally at a maximum rotational speed, for example, during draining (spin-drying). There are, therefore, cases in which a load is applied locally on a substrate to cause deformation, or a substrate strongly sticks to e.g. an attracting seal whereby release of the substrate becomes difficult.

SUMMARY OF THE INVENTION

The present invention has been made in view of the above situation in the related art. It is therefore a first object of the present invention to provide a substrate processing unit and a substrate processing apparatus which, by employing the processing unit to perform different processings with different processing liquids, can result in a reduction in space for performing an entire process of substrate processing and a reduction in energy necessary for substrate transportation.

It is a second object of the present invention to provide a substrate holding apparatus and a substrate holding method which can securely release a substrate from an attracting seal, of a material such as a rubber, even when the substrate is strongly sticking to the seal, and enables simplification and downsizing of the apparatus.

It is a third object of the present invention to provide a substrate holding apparatus and a substrate holding method which can hold a substrate during its processing while securely preventing release or fall of the substrate without resorting to a strong attracting or mechanical holding force on the substrate.

In order to achieve the above objects, the present invention provides a substrate processing unit comprising: a vertically-movable substrate holder for holding a substrate; a pan surrounding a periphery of the substrate holder; a cell, located below the substrate holder and within the pan, having in its interior a chemical processing section; and a cell cover, capable of closing a top opening of the cell, having a plurality of spray nozzles for separately spraying at least two types of processing liquids, wherein the pan and the cell each have an individual liquid discharge line.

According to this substrate processing unit, chemical processing of a substrate in the cell by the chemical processing section and processings of the substrate with at least two types of processing liquids sprayed from the spray nozzles of the cell cover, can be performed separately while the substrate is held by the substrate holder. Further, by performing processing of a substrate with a processing liquid sprayed from the spray nozzles of the cell cover with the top opening of the cell closed with the cell cover, the processing liquid sprayed from the spray nozzles can be discharged from the pan separately from the chemical solution used in the chemical processing section in the cell, without flowing into the cell. The at least two types of processing liquids, sprayed from the spray nozzles, are discharged in an admixed state from the pan. Depending on the processing liquids, however, mixing thereof is not problematic.

One of the at least two types of processing liquids may be pure water.

Therefore, a substrate, which has undergone processing with a processing liquid, such as a chemical solution sprayed from the spray nozzles, or processing in the chemical processing section of the cell, can be cleaned (rinsed) with pure water sprayed from the spray nozzles immediately after the processing. Pure water, if mixed into other processing liquid, generally does not cause a problem in treatment of the processing liquid.

Preferably, the chemical processing section performs chemical processing of the substrate by spray processing.

In this case, the substrate is spray-processed with at least three types of processing liquids consecutively.

Alternatively, the chemical processing section may perform chemical processing of the substrate by immersion processing.

In this case, the substrate is immersion-processed with one type of processing liquid (chemical solution) and spray-processed with at least two types of processing liquids.

In a preferred embodiment of the present invention, the substrate processing unit further comprises a chemical solution supply line for supplying a chemical solution to the chemical processing section and circulating the chemical solution, and a mechanism for controlling at least one of concentration, temperature and flow rate of the chemical solution to be supplied to the chemical processing section.

This makes it possible to use a chemical solution in a circulatory manner while controlling at least one of the concentration, the temperature and the flow rate.

Preferably, a pure water spray nozzle for spraying pure water toward the substrate after the chemical processing is provided within the cell.

When the substrate processing unit is employed as an electroless plating unit, a chemical solution (plating solution) remaining on a substrate can be replaced with pure water immediately after pulling the substrate up from the chemical solution (plating solution) to stop electroless plating. Further, the chemical solution can be replenished with pure water.

The present invention provides another substrate processing unit comprising: a vertically-movable substrate holder for holding a substrate; a pan surrounding a periphery of the substrate holder; a cell, located below the substrate holder and within the pan, having in its interior a chemical processing section; a cell cover, capable of closing a top opening of the cell, having a spray nozzle for spraying a processing liquid; and an airflow control section (airflow adjustment section) for controlling flow of air in the pan.

The flow of air in the pan can be adjusted or controlled by controlling at least one of a feed rate of clean air fed into the pan and a discharge rate of air discharged from the pan.

The flow of air in the pan is preferably adjusted to a downward flow, and the downward flow preferably is a laminar flow.

This can prevent leakage of a chemical atmosphere out of the pan and can also prevent local stagnation or the like of airflow in the pan, due to a turbulent airflow, which could adversely affect other processing in the pan.

The present invention provides a substrate processing apparatus comprising: a plurality of substrate processing units disposed in an apparatus frame; at least two substrate transport robots, disposed in the apparatus frame, for transferring a substrate between them and the plurality of substrate processing units; and a temporary stage, disposed between the substrate transport robots, for temporarily storing the substrate, wherein the temporary stage comprises two-stage substrate storage sections of (i) an upper section for a dry substrate and (ii) a lower section for a wet substrate, having a drying preventing function of preventing drying of substrate.

The temporary stage enables efficient transportation of a substrate in the apparatus frame and makes it possible to use fixed-type robots as the substrate transport robots, thereby reducing a cost of the apparatus in its entirety.

The present invention provides another substrate processing apparatus comprising: a plurality of substrate processing units disposed in an apparatus frame; and a substrate transport robot, disposed in the apparatus frame, for transferring a substrate between it and the plurality of substrate processing units, wherein the substrate transport robot is connected to an air discharge section for discharging internal air of the transport robot to outside and recovering this discharged air.

This can prevent the air, discharged from the interior of the substrate transport robot, for example, upon vertical movement of the transport robot, from leaking out of the transport robot. Therefore, flow of air in the vicinity of the substrate transport robot can be kept constant and contamination of a substrate with particles can be prevented.

The present invention provides yet another substrate processing apparatus comprising: a substrate processing unit, disposed in an apparatus frame, for processing a substrate with a processing liquid; and a processing liquid supply section for supplying the processing liquid to the substrate processing unit, wherein the processing liquid supply section includes a supply box detachably housing a container storing a stock solution or an additive.

This makes it possible to control components of a processing liquid to be supplied to the substrate processing unit in the apparatus, thereby maintaining a processing performance of the substrate processing unit constant.

The container preferably is a portable bottle.

Use of such a container (bottle) enables its attachment and detachment to and from the supply box to be performed easily in a simple manner.

The present invention provides a substrate holding apparatus comprising: a substrate support for supporting a substrate; and a plating head having an annular seal for holding the substrate supported by the substrate support while sealing a peripheral portion of a back surface of the substrate, wherein the plating head includes a substrate release mechanism for releasing the substrate, held by the plating head, by solely using water pressure.

By releasing a substrate, held by the plating head, using water pressure, the substrate can be securely released from the annular seal even when the substrate is strongly sticking to the annular seal, which is of a material such as a rubber. Further, sole use of water pressure for release of substrate can eliminate a need for a circuit for clean gas introduction.

Preferably, the substrate release mechanism is adapted to introduce pressurized water into the annular seal to release the substrate.

This eliminates a need to separately provide an area to which pressurized water is introduced, and thus can further simplify structure of the apparatus.

The present invention provides another substrate holding apparatus comprising: a rotatable plating head having an annular seal for holding a substrate while sealing a peripheral portion of a back surface of the substrate, wherein the plating head has a throttling mechanism which, through rotation of the plating head holding the substrate, creates a negative pressure on a back surface side of the substrate sealed with the annular seal.

A negative pressure, created on the back surface side of a substrate sealed with the annular seal by the throttling mechanism through rotation of the plating head, can act as a holding force on the substrate. The throttling mechanism may be provided in any desired number according to a necessary holding force.

The throttling mechanism includes, for example, an air vent hole provided in a cover member for covering an entire back surface of a substrate held by the plating head, and a throat portion communicating with the air vent hole, and creates a negative pressure within the air vent hole by utilizing a venturi effect produced by an airflow created in the throat portion by rotation of the plating head.

By increasing a velocity of the airflow created in the throat portion of the throttling mechanism in proportion to a rotational speed of the plating head to thereby lower an internal pressure (negative pressure) of the air vent hole, a holding force on the substrate as produced by the throttling mechanism can be enhanced in proportion to the rotational speed of the plating head.

Preferably, the plating head attracts and holds the substrate by vacuuming an interior of the annular seal.

Preferably, the plating head further includes a pusher for pressing on a substrate held by the annular seal in a direction away from the plating head.

Therefore, even when the substrate is strongly sticking to the annular seal, the substrate can be securely released from the annular seal by utilizing pressure of the pusher.

The present invention provides a substrate holding method comprising: holding a substrate by a plating head while sealing a peripheral portion of a back surface of the substrate with an annular seal; and releasing the substrate, held by the plating head, by solely using water pressure.

The present invention provides another substrate holding method comprising: holding a substrate by a plating head while sealing a peripheral portion of a back surface of the substrate with an annular seal; and creating a negative pressure on a back surface side of the substrate, defined by the back surface of the substrate and the annular seal, by rotation of the plating head holding the substrate.

A substrate processing unit according to the present invention may include a substrate holding apparatus for holding a substrate, and a processing tank for bringing a surface of a substrate, held by the substrate holding apparatus, into contact with a processing liquid stored therein. The substrate holding apparatus may include a substrate support for supporting a substrate, and a plating head having an annular seal for holding the substrate supported by the substrate support while sealing a peripheral portion of a back surface of the substrate, wherein the plating head includes a substrate release mechanism for releasing the substrate, held by the plating head, by solely using water pressure.

A substrate processing unit according to the present invention may include a substrate holding apparatus for holding a substrate, and a processing tank for bringing a surface of a substrate, held by the substrate holding apparatus, into contact with a processing liquid stored therein. The substrate holding apparatus may include a rotatable plating head having an annular seal for holding a substrate while sealing a peripheral portion of a back surface of the substrate, wherein the plating head has a throttling mechanism which, through rotation of the plating head holding the substrate, creates a negative pressure on a back surface side of the substrate sealed with the annular seal.

BRIEF DESCRIPTION OF THE DRAWINGS

FIG. 10 is a schematic view of an electroless plating unit (substrate processing unit) as processing of a substrate is being performed with a top opening of a cell closed with a cell cover;

FIG. 11 is a schematic view of the electroless plating unit (substrate processing unit) as processing of a substrate is being performed in the cell with the cell cover retreated;

FIG. 12 is a front view of a supply box;

FIG. 13 is a sectional side view of the supply box;

FIG. 15 is a diagram showing a system associated with the supply box;

DETAILED DESCRIPTION OF THE PREFERRED EMBODIMENTS

Preferred embodiments of the present invention will now be described with reference to the drawings. The following description illustrates a case of applying the present invention to an electroless plating apparatus adapted to efficiently form a protective film 9 (see FIG. 1) by electroless plating on surfaces of interconnects formed on a substrate. The present invention is, of course, applicable to other substrate processing apparatuses, such as an electroplating apparatus, a CVD apparatus, and the like.

Figure 2:
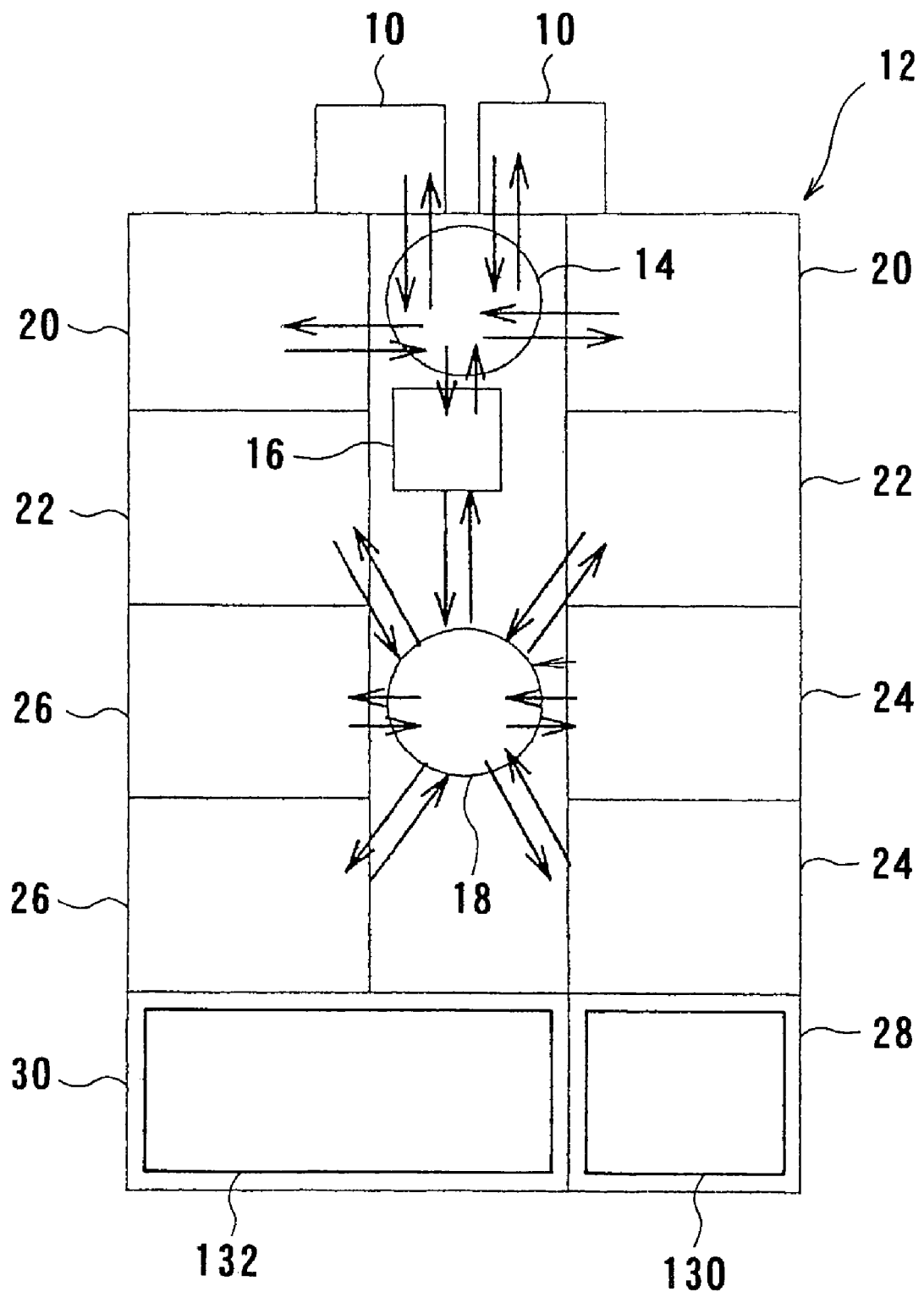
FIG. 2 is a layout plan view of a substrate processing apparatus (electroless plating apparatus) according to an embodiment of the present invention.
Figure 3:
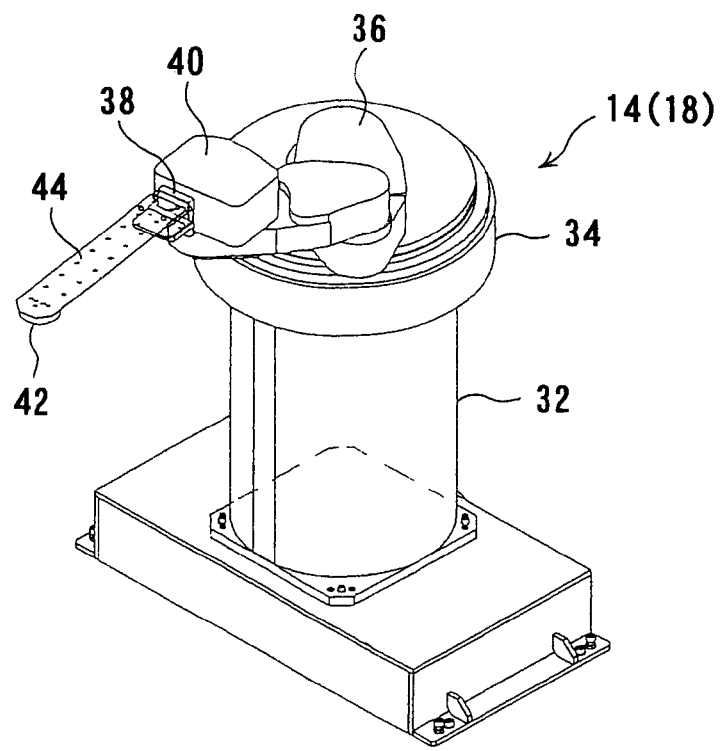
FIG. 3 is a perspective view of a substrate transport robot.
Figure 4:
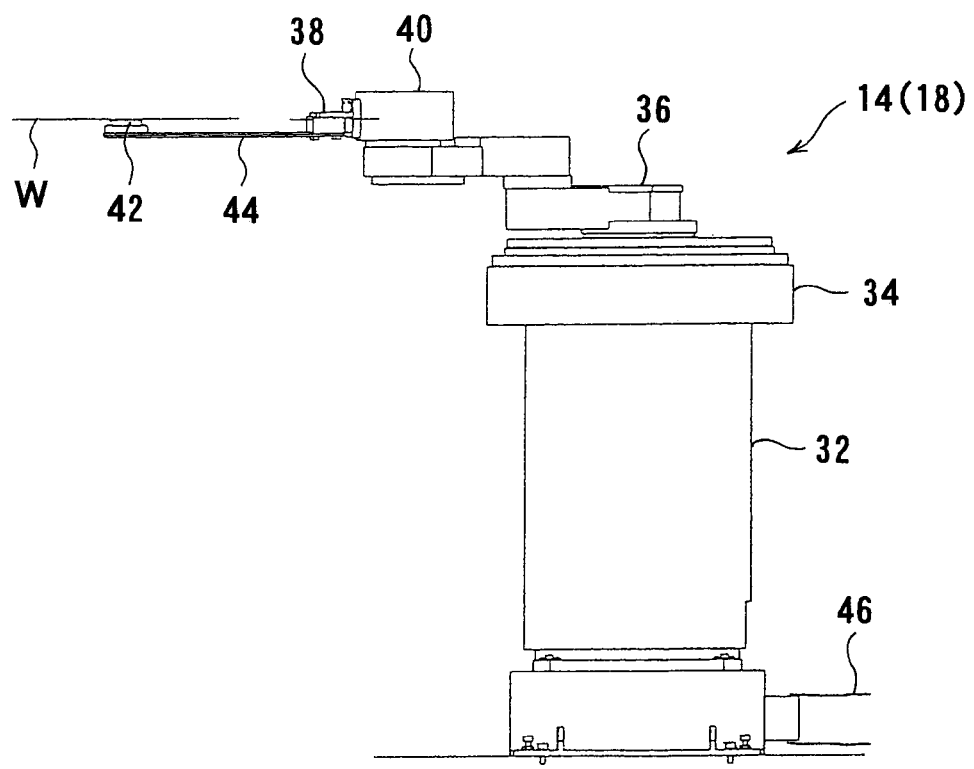
FIG. 4 is a front view of the substrate transport robot holding a substrate.

FIG. 2 shows a layout plan view of a substrate processing apparatus (electroless plating apparatus) according to an embodiment of the present invention. As shown in FIG. 2, the substrate processing apparatus includes a rectangular apparatus frame 12, and a transport box 10, such as a SMIF box, detachably mounted to the apparatus frame 12 and housing therein a number of substrates such as semiconductor wafers. Located centrally in the apparatus frame 12, there are disposed in series a first substrate transport robot 14, a temporary stage 16 and a second substrate transport robot 18. Located on both sides thereof, there are disposed pairs of cleaning/drying units 20, post-plating processing units 22, pre-plating processing units 24 and electroless plating units 26. Further, located on a side opposite to the transport box 10, there are provided a first processing liquid supply section 28 for supplying a processing liquid to the pre-plating processing units 24, and a second processing liquid supply section 30 for supplying a processing liquid to the electroless plating units 26.

The substrate processing apparatus (electroless plating apparatus) is installed in a clean room. An internal pressure of the apparatus frame 12 is set at a higher pressure than an internal pressure of the clean room so as to prevent air from flowing from the apparatus frame 12 into the clean room. There is a downward flow (down-flow) of fresh air in the apparatus frame 12.

FIGS. 3 through 5B show the first substrate transport robot 14. The second substrate transport 18 has the same construction as the first substrate transport robot 14. The first substrate transport robot 14 is a fixed-type robot, and includes a vertically-retractable body 32, a rotational drive section 34 mounted on a top of the body 32, and a horizontally-retractable robot arm 36 mounted to the rotational drive section 34. To a front end of the robot arm 36 is mounted a reversing mechanism 40 that rotates a horizontally-extending rotatable shaft 38, and to the rotating shaft 38 of the reversing mechanism 40 is coupled a hand 44 having, at its front end, an attraction member 42 for attracting and holding a substrate W by attracting the back surface of the substrate W.

The substrate transport robots 14, 18 reverse a substrate W from face-up to face-down by the reversing mechanism 40 during transportation of the substrate W, for example, from the transport box 10 to the temporary stage 16 with the first substrate transport robot 14. Accordingly, the hand 44 is of a back surface-attraction type. Provision of the reversing mechanism 40 in the substrate transport robots 14, 18 eliminates a need to separately provide for a reversing device, thus simplifying the apparatus.

Figure 5A:
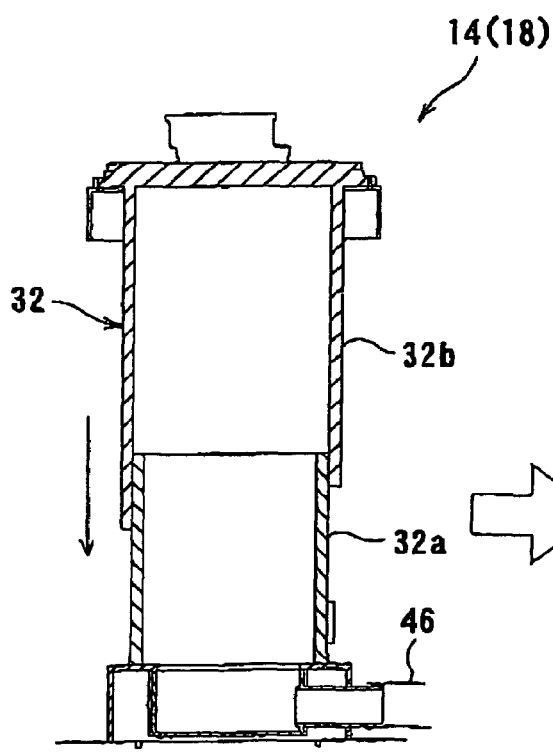
FIG. 5A is a cross-sectional view showing the substrate transport robot as a body is extended.
Figure 5B:
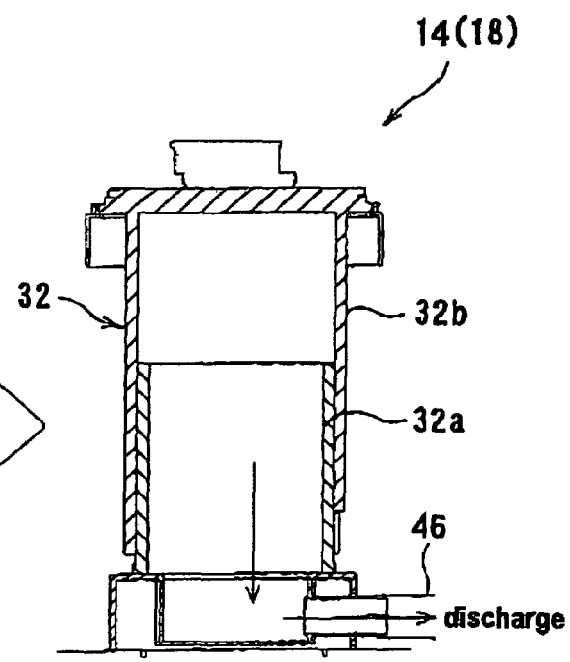
FIG. 5B is a cross-sectional view showing the substrate transport robot as the body is contracted.

As shown in FIGS. 5A and 5B, the body 32 has a nested construction with a hollow inner body 32a and a hollow outer body 32b, and thus is retractable. A ventilation duct (air discharge section) 46, in communication with interiors of the hollow inner body 32a and outer body 32b, is connected to a bottom of the body 32 so that internal air of the first substrate transport robot 14 is discharged through the ventilation duct 46 to an exterior and recovered.

This can prevent air, discharged from an interior of the first substrate transport robot, for example, upon vertical movement of the outer body 32b of the first transport robot 14, from passing between the inner body 32a and the outer body 32b and leaking out of the transport robot 14. Therefore, flow of air in the vicinity of the substrate transport robot 14 can be kept constant and contamination of a substrate W with particles can be prevented.

Figure 6:
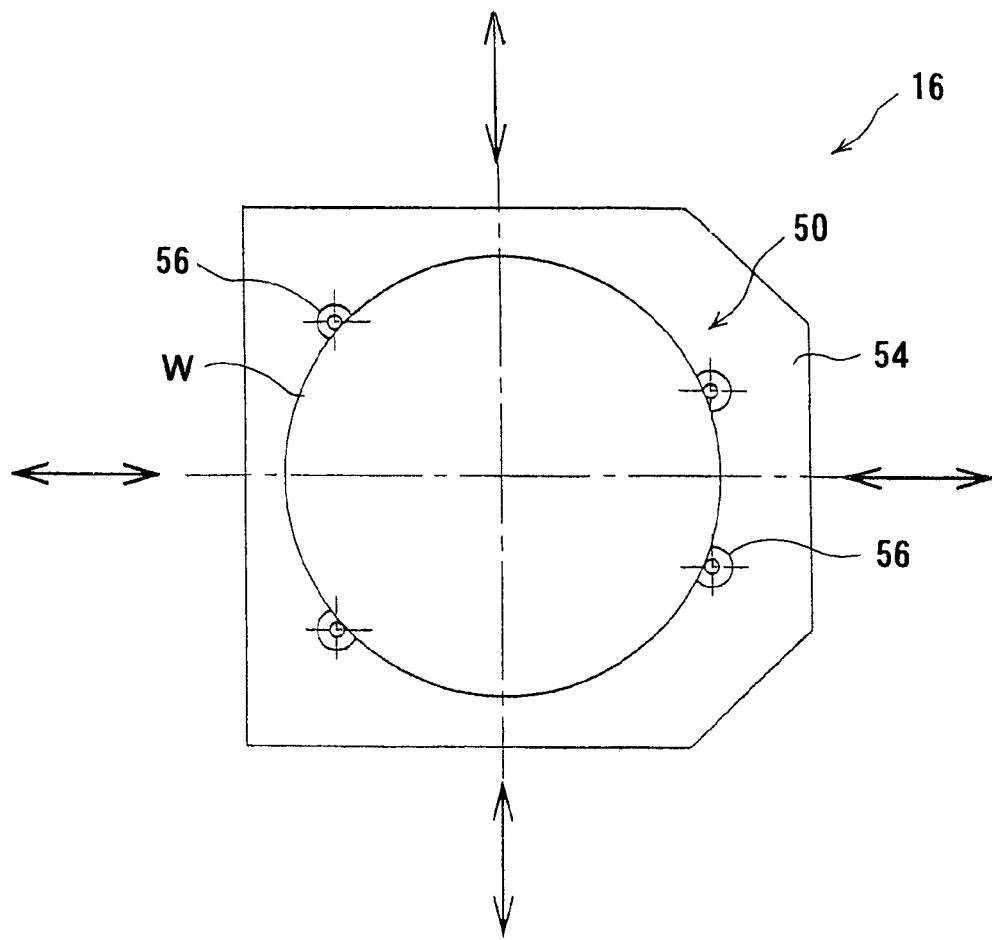
FIG. 6 is a plan view of a temporary stage.
Figure 7:
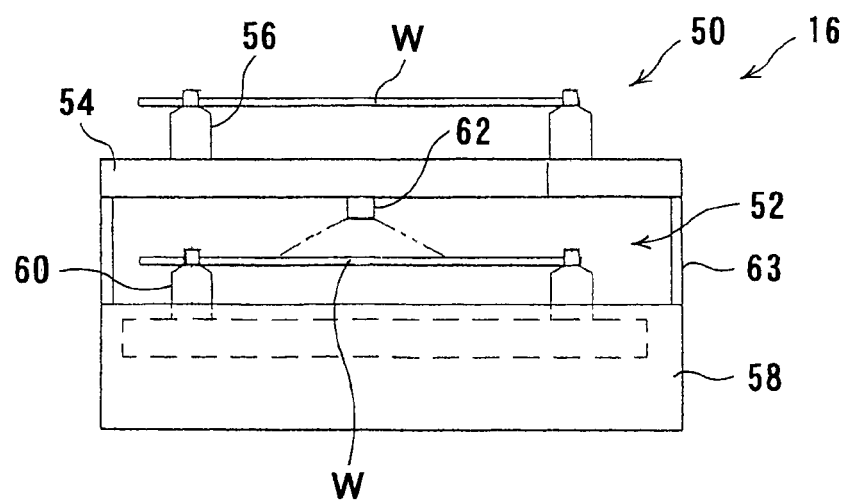
FIG. 7 is a front view of the temporary stage.

FIGS. 6 and 7 show the temporary stage 16. The temporary stage 16 is disposed between the first substrate transport robot 14 and the second substrate transport robot 18, and is designed to take in and out a substrate W in one direction from each of the first and the second substrate transport robots 14, 18. It is, of course, possible to design the temporary stage 16 to take in and out a substrate in any desired direction. Provision of the temporary stage 16 for temporary storage of the substrate between the substrate transport robots 14, 18 enables efficient transportation of a substrate W in the apparatus frame 12, and makes it possible to use fixed-type robots as the substrate transport robots 14, 18, thereby reducing a cost of the apparatus in its entirety.

The temporary stage 16 includes an upper dry substrate storage section 50 and a lower wet substrate storage section 52, which sections are separated by a partition plate 54. The dry substrate storage section 50 includes a plurality of support pins 56 mounted vertically on the partition plate 54 at positions along a periphery of a substrate W, and holds the substrate W by the support pins 56 while positioning the substrate W with a tapered surface provided in an upper portion of each support pin 56. Similarly, the wet substrate storage section 52 includes a plurality of support pins 60 mounted vertically on a base plate 58 at positions along a periphery of a substrate W, and holds the substrate W by the support pins 60 while positioning the substrate W with a tapered surface provided in an upper portion of each support pin 60.

To a lower surface of the partition plate 54 is mounted a pure water spray nozzle 62 as a drying preventing mechanism for spraying pure water toward a front surface (upper surface) of the substrate W held by the support pins 60 of the wet substrate storage section 52, thereby preventing drying of the substrate W. Further, an openable/closable shutter 63 for preventing pure water, sprayed from the pure water spray nozzle 62 toward the substrate W, from leaking to an exterior, is provided between the partition plate 54 and the base plate 58.

A substrate W, which has been held and transported by the first substrate transport robot 14, is reversed and then positioned and held by the support pins 56 of the upper dry substrate storage section 50. The substrate W, which has been held and transported by the second substrate transport robot 18 after a series of processings, is positioned and held by the support pins 60 of the lower wet substrate storage section 52. Whether or not a substrate W is held in the dry substrate storage section 50 or the wet substrate storage section 52 is detected by a not-shown sensor. Though in this embodiment a substrate W is reversed by the first substrate transport robot 14, it is also possible to use the second substrate transport robot 18 to reverse the substrate W.

Figure 8:
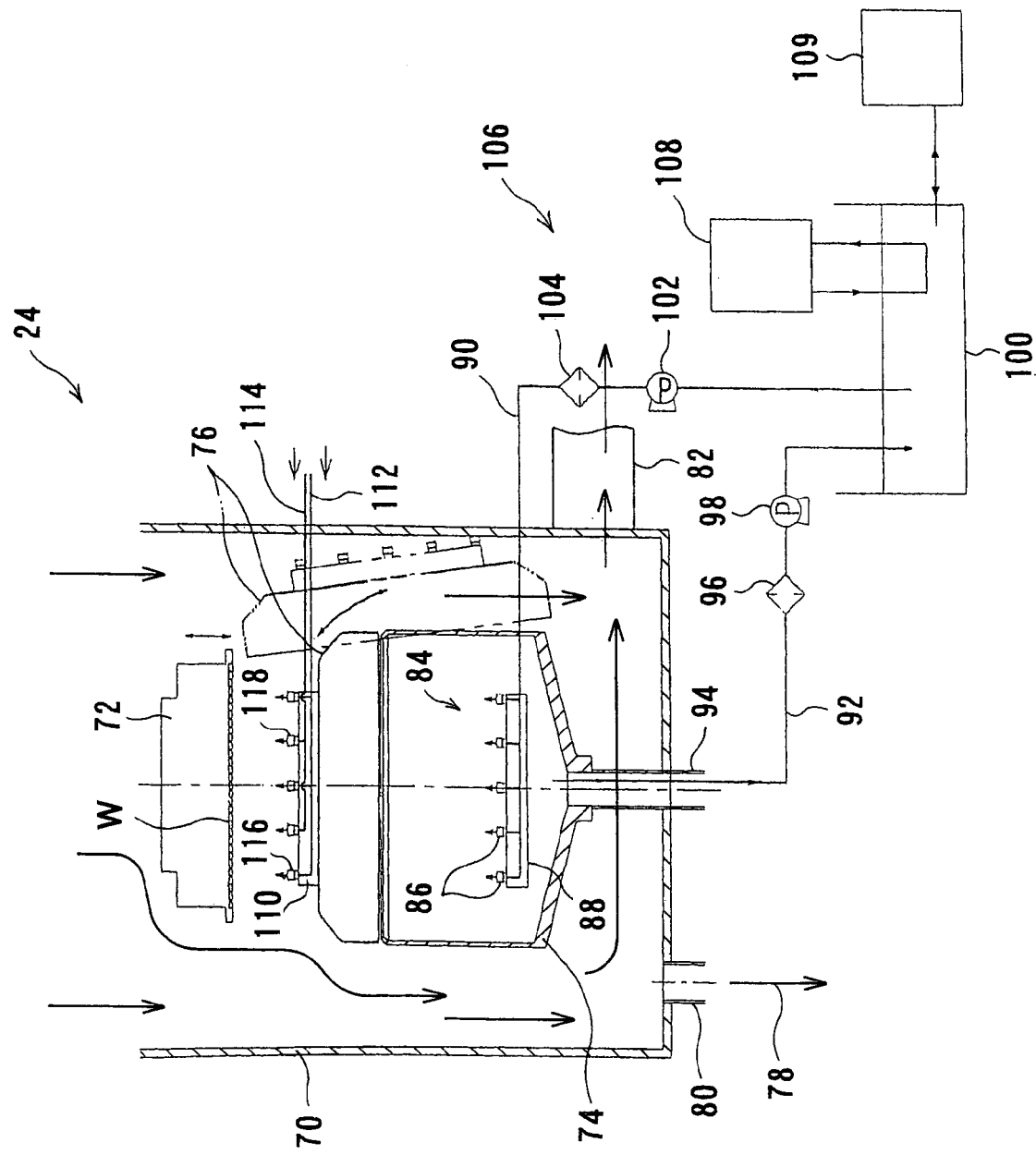
FIG. 8 is a schematic view of a pre-plating processing unit (substrate processing unit) as processing of a substrate is being performed with a top opening of a cell closed with a cell cover.
Figure 9:
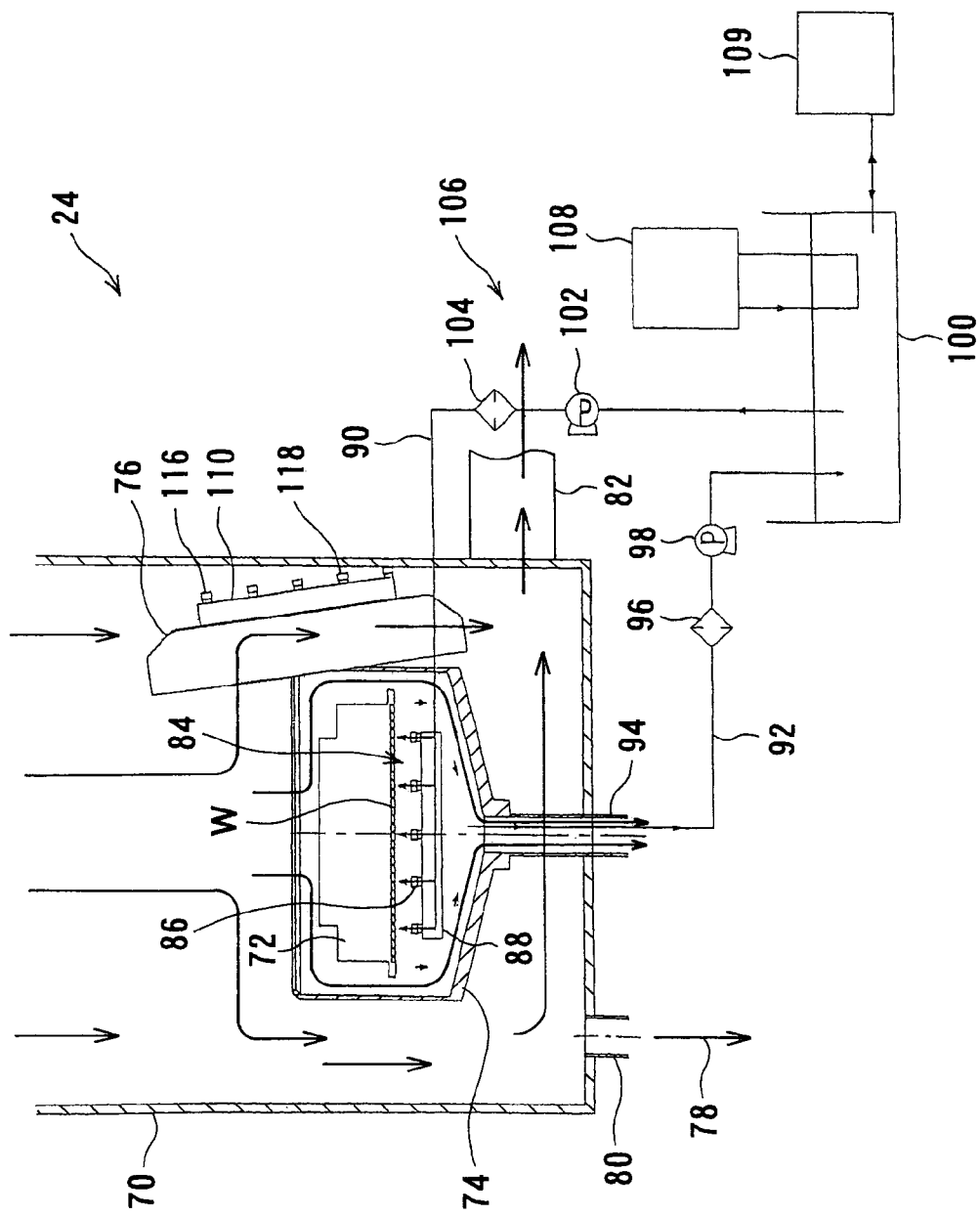
FIG. 9 is a schematic view of the pre-plating processing unit (substrate processing unit) as processing of a substrate is being performed in the cell with the cell cover retreated.

FIGS. 8 and 9 show pre-plating processing unit 24. The pre-plating processing unit 24 represents an embodiment of a substrate processing unit according to the present invention. The pre-plating processing unit (substrate processing unit) 24 includes a bottomed, vertically-extending cylindrical pan 70, a vertically-movable substrate holder 72 disposed within the pan 70, a cell 74 located within the pan 70 and below the substrate holder 72, and a cell cover 76 located within the pan 70 and capable of closing a top opening of the cell 74.

The substrate holder 72 moves vertically by a drive mechanism and rotates by a substrate rotating motor of a drive section, as will be described later. The substrate holder 72 has, on a lower surface side, a ring-shape annular seal 190 (see FIG. 16), and is designed to bring the annular seal 190 into pressure contact with a peripheral portion of a substrate W so as to hold the substrate W while sealing the peripheral portion with the annular seal 190. This can prevent a processing liquid from intruding into a back surface side of the substrate W held by the substrate holder 72.

The pan 70, at its bottom, is provided with a drain port 80 which is connected to a liquid discharge line 78 for discharging a processing liquid, which has flowed into the pan 70, to outside. Further, the pan 70, at its lower side portion, is connected to a ventilation duct 82 provided with a damper therein, which constitutes an airflow adjustment section for adjusting flow of air in the pan 70. Thus, the flow of air in the pan 70 is adjusted (controlled) by controlling a feed rate of clean air fed into the pan 70 and a discharge rate of air discharged from the pan 70. In this embodiment, the flow of air in the pan 70 is adjusted to a downward flow. This can prevent leakage of a chemical atmosphere out of the pan 70 and can also prevent local stagnation or the like of airflow in the pan 70, due to a turbulent airflow, which could adversely affect other processing in the pan 70.

According to this embodiment, the cell 74, in its interior, is provided with a chemical processing section 84 for performing chemical processing of a substrate by spray processing. In particular, the chemical processing section 84 includes a nozzle board 88 having, mounted on its upper surface, a plurality of chemical solution spray nozzles 86 for spraying a chemical solution upwardly, and a chemical solution supply line 90 for supplying the chemical solution to the nozzle board 88. Thus, the chemical solution is sprayed from the chemical solution spray nozzles 86 toward a lower surface (front surface) of a substrate W held by the substrate holder 72 to perform processing of the substrate W.

The cell 74, at its bottom, is provided with a drain port 94 which is connected to a liquid discharge line 92 for discharging a chemical solution, which has flowed into the cell 74, to outside. According to this embodiment, the liquid discharge line 92 is connected to a chemical solution tank 100, with a filter 96 and a feed pump 98 being interposed in the liquid discharge line 92. The chemical solution supply line 90 is also connected to the chemical solution tank 100, with a feed pump 102 and a filter 104 being interposed in the chemical solution supply line 90. A chemical solution circulation line 106, circulating a chemical solution for reuse of the chemical solution, is thus constructed.

Further, according to this embodiment, the pre-plating processing unit 24 is also provided with a chemical solution temperature control section 108 for controlling a chemical solution in the chemical solution tank 100 at a constant temperature, and a chemical solution analysis/replenishment section 109 for sampling and analyzing the chemical solution in the chemical solution tank 100 and replenishing a deficient component so as to keep the composition of the chemical solution in the chemical solution tank 100 constant. This makes it possible to keep the temperature and the composition of the chemical solution in the chemical solution tank 100 constant, and use the chemical solution in a circulatory manner while supplying the chemical solution, having constant temperature and composition, through the chemical solution supply line 90. A flow rate of the chemical solution, sprayed from the chemical solution spray nozzles 86, is controlled by the feed pump 102.

A nozzle board 110 is mounted on an upper surface of the cell cover 76 capable of closing and covering the top opening of the cell 74. According to this embodiment, the nozzle board 110 is connected to a chemical solution supply line 112 for supplying a chemical solution (first processing liquid) and to a pure water supply line 114 for supplying pure water (second processing liquid). Two types of spray nozzles, viz. chemical solution spray nozzles 116, communicating with the chemical solution supply line 112, for spraying the chemical solution, and pure water spray nozzles 118, communicating with the pure water supply line 114, for spraying pure water, are disposed in alternate lines on the nozzle board 110.

A substrate, which has undergone processing with a processing liquid, such as a chemical solution supplied through the chemical solution supply line 112 and sprayed from the chemical solution spray nozzles 116, can be cleaned (rinsed) with pure water sprayed from the pure water spray nozzles 118 immediately after this processing. Pure water, if mixed into other processing liquid, generally does not cause a problem in treatment of the processing liquid. In this embodiment, the chemical solution sprayed from the chemical solution spray nozzles 116 is thrown away after use without recovery. However, as with the above-described chemical processing section 84 provided in the cell 74, it is also possible to recover and reuse a chemical solution in a circulatory manner.

Operation of the pre-plating processing unit 24 will now be described. First, the top opening of the cell 74 is covered with the cell cover 76, and then the substrate holder 72 holding a substrate W is lowered to a predetermined position (first processing position) above the cell cover 76, as shown in FIG. 8. A pre-cleaning solution, which is an acid solution, such as $H_2SO_4$, is used as a chemical solution (first processing liquid) in this embodiment. The chemical solution (acid solution such as $H_2SO_4$) is sprayed from the chemical solution spray nozzles 116 of the cell cover 76 toward the substrate W. Thereafter, pure water is sprayed from the pure water spray nozzles 118 of the cell cover 76 toward the substrate W to clean (rinse) the substrate W.

Thereafter, the cell cover 76 is retreated to a retreat position beside the cell 74 to open the top opening of the cell 74, and the substrate holder 72 holding the substrate W is lowered to a predetermined position (second processing position) above the chemical processing section 84, as shown in FIG. 9. A catalyst application solution, such as a mixed solution of $PdCl_2$ and $H_2SO_4$, is used as a chemical solution in this embodiment. The chemical solution (catalyst application solution such as a mixed solution of $PdCl_2$ and $H_2SO_4$) is sprayed from the chemical solution spray nozzles 86 of the chemical processing section 84 toward the substrate W.

Next, after raising the substrate holder 72 holding the substrate W to the predetermined position (first processing position), the top opening of the cell 74 is covered with the cell cover 76. Pure water is then sprayed from the pure water spray nozzles 118 of the cell cover 76 toward the substrate W to clean (rinse) the substrate W. The substrate W, which has undergone the above pre-processings, is then sent to a next process step.

During the above processings, a downward laminar flow of air is created in the pan 70, as shown in FIGS. 8 and 9, and most of the air is discharged through the ventilation duct 82 to outside. This can prevent leakage of a chemical atmosphere out of the pan 70 and can also prevent local stagnation or the like of airflow in the pan 70, due to a turbulent airflow, which could adversely affect other processing in the pan 70.

Furthermore, chemical processing of a substrate W in the cell 74 and processings of the substrate W with at least two types of processing liquids sprayed from the spray nozzles 116, 118 of the cell cover 76 can be performed separately, while the substrate W is held by the substrate holder 72. By performing processing of a substrate W with a processing liquid sprayed from the spray nozzles 116, 118 of the cell cover 76 with the top opening of the cell 74 closed with the cell cover 76, processing liquids sprayed from the spray nozzles 116, 118 can be discharged through the liquid discharge line 78 out of the pan 70 without flowing into the cell 74. This can prevent processing liquids, including a chemical solution, sprayed from the spray nozzles 116, 118 of the cell cover 76, from being mixed into a chemical solution used in the chemical processing section 84 of the cell 74.

FIGS. 10 and 11 show electroless plating unit 26. The electroless plating unit 26 represents another embodiment of a substrate processing unit according to the present invention. The electroless plating unit (substrate processing unit) 26 differs from the above-described pre-plating processing unit 24 in the following respects.

Cell 74 of the electroless plating unit 26, in its interior, is provided with a chemical processing section 120 for performing chemical processing of a substrate by immersion processing. The chemical processing section 120 includes a bath 122 for storing a chemical solution, such as a plating solution, and immersing a substrate W held by substrate holder 72 in the chemical solution. Chemical solution supply line 90 extending from chemical solution tank 100 holding the chemical solution, such as a plating solution, is connected to a chemical solution supply section 124 provided at a bottom of the bath 122, while liquid discharge line 92 communicates with a chemical solution recovery groove 126, provided around the bath 122, for recovering chemical solution that has overflowed a peripheral wall of the bath 122. A chemical solution circulation line 106, circulating the chemical solution for its reuse, is thus constructed.

Further, according to this embodiment, located slightly above a liquid surface of the chemical solution stored in the bath 122 of the cell 74, there are provided pure water spray nozzles 128, connected to a pure water supply line 127, for spraying pure water, supplied through the pure water supply line 127, slightly upwardly.

Operation of the electroless plating unit 26 will now be described. First, a top opening of the cell 74 is covered with cell cover 76, and then the substrate holder 72 holding a substrate W is lowered to a predetermined position (first processing position) above the cell cover 76, as shown in FIG. 10. A post-catalyst application processing solution, for example, a solution of sodium citrate, is used as a chemical solution (first processing liquid) in this embodiment. The chemical solution (post-catalyst application processing solution of e.g. a solution of sodium citrate) is sprayed from chemical solution spray nozzles 116 of the cell cover 76 toward the substrate W. Thereafter, pure water is sprayed from pure water spray nozzles 118 of the cell cover 76 toward the substrate W to clean (rinse) the substrate W.

Next, while filling the bath 122 with a chemical solution (plating solution) and circulating the chemical solution whose temperature and composition are kept constant, the cell cover 76 is retreated to a retreat position beside the cell 74 to open the top opening of the cell 74, and the substrate holder 72 holding the substrate W is lowered to immerse the substrate W in the chemical solution (plating solution) in the bath 122, as shown in FIG. 11, thereby performing electroless plating (electroless CoWP cap plating) of a surface of the substrate W. The composition of the chemical solution (plating solution) is, for example, as follows:

Composition of plating solution
$CoSO_4 \cdot 7H_2O$: 23 g/L
$Na_3C_6H_5O_7 \cdot 2H_2O$: 145 g/L
$(NH_4)_2SO_4$: 31 g/L
$NaH_2PO_2 \cdot H_2O$: 18 g/L
$Na_2WO_4 \cdot 2H_2O$: 10 g/L
pH: 8.8 (adjusted with aqueous NaOH solution)

After pulling the substrate W up from the liquid surface of the chemical solution, pure water is sprayed from pure water spray nozzles 128 toward the substrate W, thereby replacing the chemical solution (plating solution) remaining on the surface of the substrate W with pure water and stopping an electroless plating reaction. By thus stopping the electroless plating reaction promptly after pulling the substrate W up from the chemical solution (plating solution), a plated film can be prevented from becoming uneven. Furthermore, use of pure water e.g. in an amount of 10 to 20 cc can replenish moisture vaporized from the chemical solution so as to keep the concentration of the chemical solution constant.

Next, after raising the substrate holder 72 holding the substrate W to the predetermined position (first processing position), the top opening of the cell 74 is covered with the cell cover 76. Pure water is then sprayed from the pure water spray nozzles 118 of the cell cover 76 toward the substrate W to clean (rinse) the substrate W. The substrate W, which has undergone this electroless plating, is then sent to a next process step.

During the above processings, a downward laminar flow of air is created in the pan 70, as shown in FIGS. 10 and 11, and the air is discharged through ventilation duct 82 to outside. Further, at least two types of processing liquids, sprayed from the spray nozzles 116, 118 of the cell cover 76, can be prevented from being mixed into the chemical solution (plating solution).

As shown in FIG. 2, the first processing liquid supply section 28 and the second processing liquid supply section 30 of the substrate processing apparatus include supply boxes 130 and 132 respectively, with each box detachably holding a container storing a stock solution or an additive. The supply box 130 of the first processing liquid supply section 28 is to prepare, for example, a chemical solution (first processing liquid) which is an acid solution, such as $H_2SO_4$, for use in the pre-plating processing unit 24, and the supply box 132 of these second processing liquid supply section 30 is to prepare, for example, a chemical solution (first processing liquid), such as a solution of sodium citrate, for use in the electroless plating unit 26. These two supply boxes have the same construction, and hence a description will be given of one supply box 130.

Figure 14:
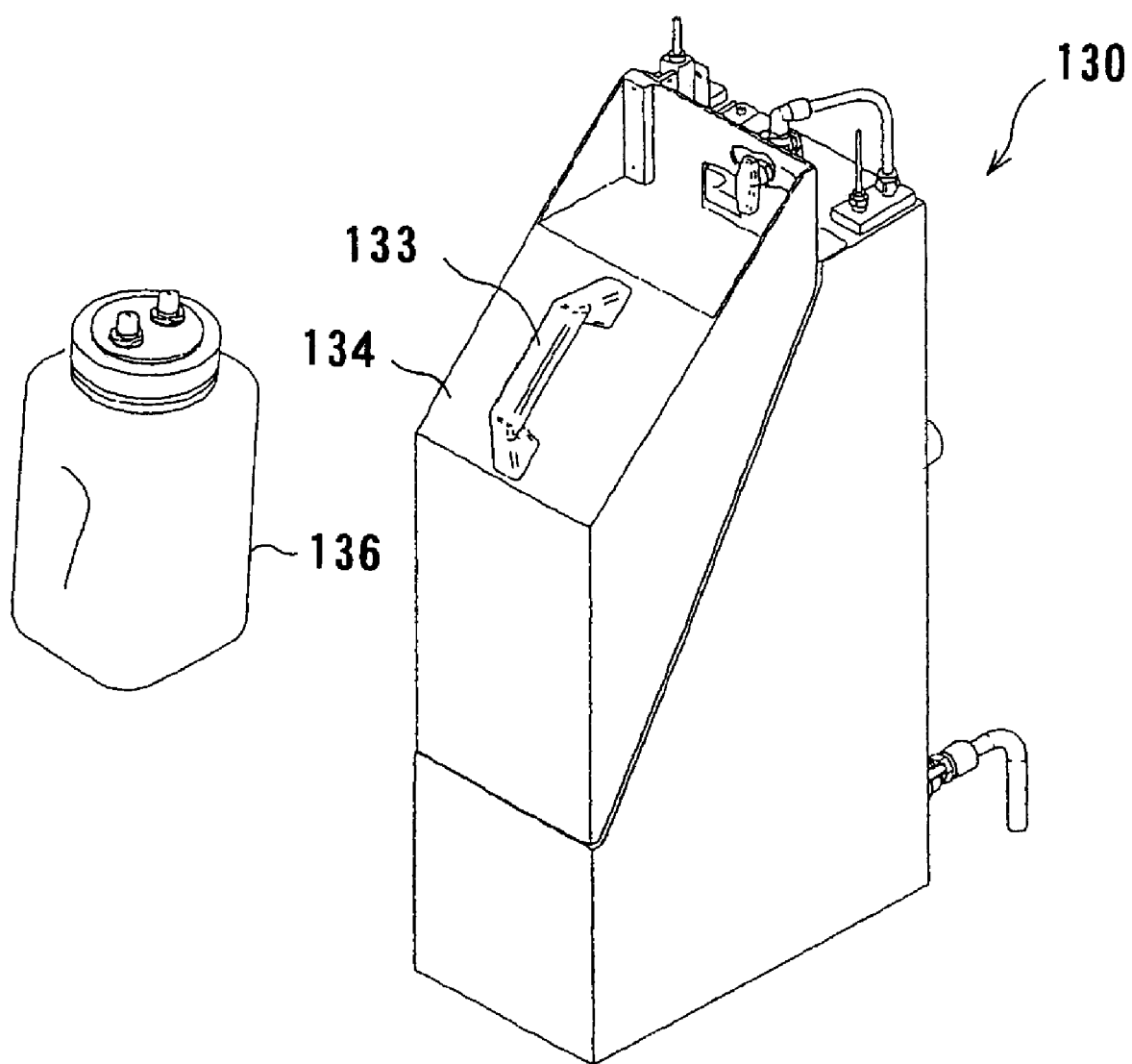
FIG. 14 is a perspective view showing the supply box and a container.

FIGS. 12 through 14 show the supply box 130. The supply box 130, according to this embodiment, has a cover 134 which is openable and closable by a handle 133. After opening the cover 134, a container 136, such as a portable bottle, storing e.g. a stock solution therein, is placed on a stage 138 and housed in the supply box 130. A weight measuring device, such as a load cell, for detecting presence or absence of the container 136 and volume of e.g. a stock solution in the container 136, is installed in the stage 138, and an alert is issued when contents, such as a stock solution, of the container 136 runs short.

A pump 140, a back-pressure regulating valve 142 (see FIG. 15) and a flow meter 144 (see FIG. 15) are provided within the supply box 130, so that by the actuation of the pump 140, a stock solution, etc. at a predetermined pressure is supplied in a predetermined amount from the container 136 through a supply pipe 146. According to this embodiment, as shown in FIG. 15, the stock solution, etc., supplied from the container 136 of the supply box 130, is supplied through the supply pipe 146 into a chemical solution tank 148 where it is diluted with pure water, which is supplied through a valve 150 and a flow meter 152 into the chemical solution tank 148, to prepare a chemical solution (first processing liquid) having a predetermined concentration.

By thus controlling, in the apparatus, components of a chemical solution (first processing liquid) to be supplied to the pre-plating processing unit (substrate processing unit) 24, a processing performance of the pre-plating processing unit 24 can be kept constant. Further, use of a portable bottle as the container 136 enables its attachment and detachment to and from the supply box 130 to be performed easily in a simple manner.

This holds also for the electroless plating unit 26.

Figure 16:
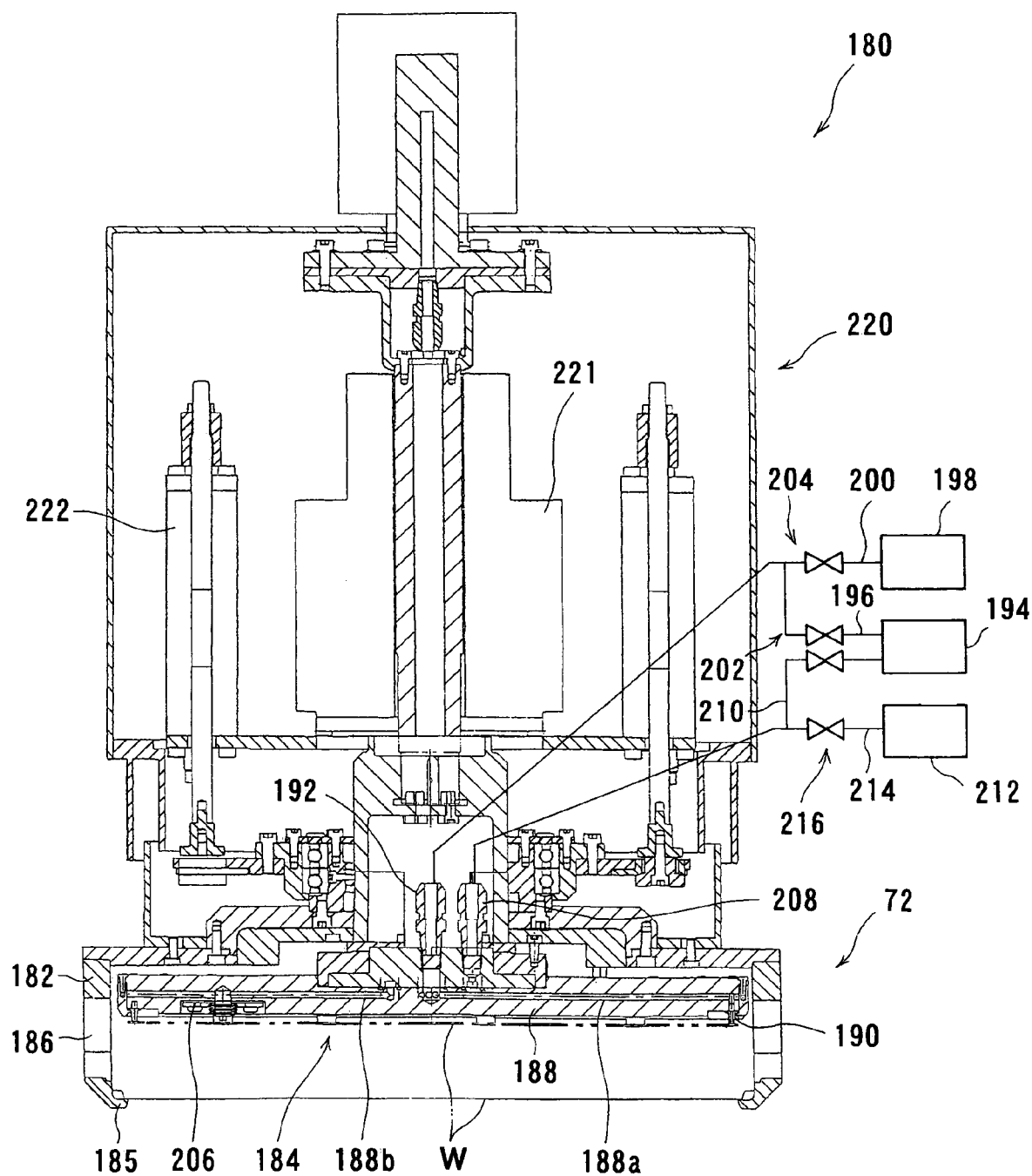
FIG. 16 is a vertical sectional front view showing a substrate holding apparatus according to an embodiment of the present invention.

FIG. 16 shows a substrate holding apparatus 180 having substrate holder 72, provided in the pre-plating processing unit 24 and the electroless plating unit 26. As shown in FIG. 16, the substrate holding apparatus 180 includes the substrate holder 72 and a drive section 220. The substrate holder 72 includes a downwardly-open, generally cylindrical substrate support 182 and a generally circular plating head 184 vertically movably housed in the substrate support 182. The drive section 220 includes a substrate rotating motor 221 for rotationally driving the plating head 184, and a lifting cylinder 222 for moving up and down the substrate support 182 to predetermined positions. The plating head 184 is rotationally driven by the substrate rotating motor 221, and the substrate support 182 is moved vertically by the lifting cylinder 222. Thus, the plating head 184 only rotates without vertical movement, and the substrate support 182 rotates together with the plating head 184 and moves vertically relative to the plating head 184.

The substrate support 182 has, at its lower end, a substrate rest portion 185, projecting inwardly in a ring, for temporarily placing a substrate W thereon. Substrate insertion openings 186 for inserting a substrate W into the substrate support 182 are provided in a peripheral wall of the substrate support 182.

The plating head 184 includes a disk-shaped cover member 188 having, in its interior, a radially extending vacuum/pure water supply passage 188a. A ring-shaped annular seal 190, having in its lower surface a circumferential groove 190a (see FIG. 17) extending continuously in a circumferential direction, is mounted in a peripheral portion of a lower surface of the cover member 188. The vacuum/pure water supply passage 188*a* is selectively connected, via a joint 192 provided in the cover member 188, to one of a vacuum line 196 extending from a vacuum source 194 and a pure water supply line 200 extending from a pure water supply source 198, and communicates with the circumferential groove 190*a* via a through-hole 190*b* provided within the annular seal 190. A substrate holding mechanism 202 for attracting and holding a substrate W by the annular seal 190, and a substrate release mechanism 204 for releasing the substrate W attracted and held by the annular seal 190 are thus constructed.

In particular, a substrate W is attracted and held by the annular seal 190 by bringing the lower surface of the annular seal 190 into pressure contact with a peripheral portion of a back surface (upper surface) of the substrate W and vacuuming an interior of the circumferential groove 190*a* of the annular seal 190 through the vacuum line 196 constituting the substrate holding mechanism 202. The substrate W attracted and held by the annular seal 190 is released by introducing pure water into the interior of the circumferential groove 190*a* of the annular seal 190 and jetting the pure water toward the substrate W through the pure water supply line 200 constituting the substrate release mechanism 204.

By thus releasing a substrate W, held and attracted by the annular seal 190 of the plating head 184, using water pressure, the substrate W can be securely released from the annular seal 190 even when the substrate W is strongly sticking to the annular seal 190, which is of a material such as a rubber. Further, sole use of water pressure for release of substrate W can eliminate need for a circuit for clean gas introduction. Though pure water is used in this embodiment, it is, of course, possible to use a liquid other than pure water.

Furthermore, the substrate release mechanism 204 is designed to introduce pressurized water into an interior of the annular seal 190 to release the substrate W. This eliminates a need to separately provide an area to which pressurized water is introduced, and thus can further simplify structure of the apparatus.

Figure 17:
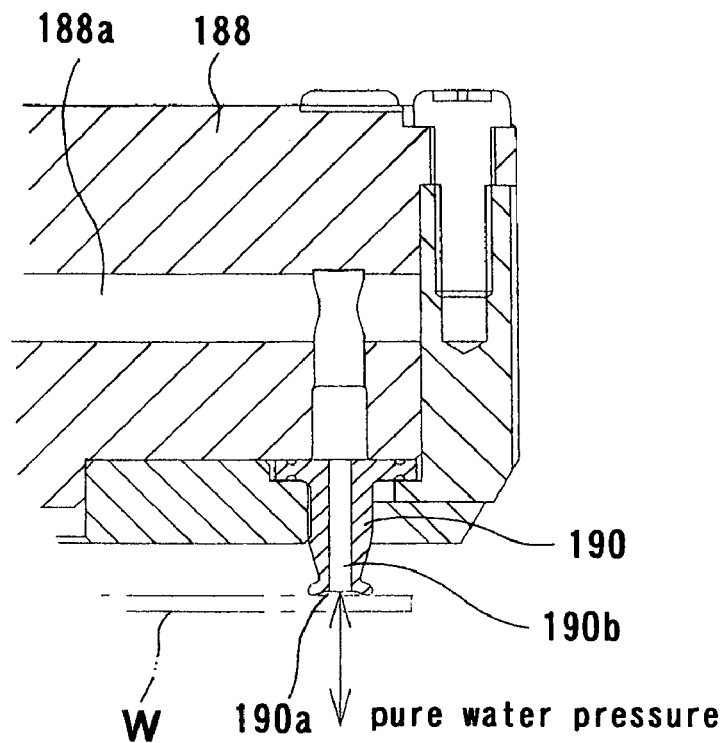
FIG. 17 is an enlarged sectional view showing an annular seal of the substrate holding apparatus shown in FIG. 16.

The annular seal 190 is composed of an elastic material, such as a rubber, and mounted in a lower surface of the cover member 188 with its lower end portion projecting from the lower surface of the cover member 188, as shown in FIG. 17, and, when attracting and holding a substrate W in the above manner, functions as a seal to prevent intrusion of a processing liquid (plating solution) onto the back surface (an inner side of a ring-shaped sealed portion sealed with the annular seal 190) of the substrate W. A shape of the annular seal 190 is not limited to that shown diagrammatically, and any shape or structure may be, of course, employed insofar as it allows attraction of a substrate with a ring-shaped sealing portion having a predetermined width.

Figure 19:
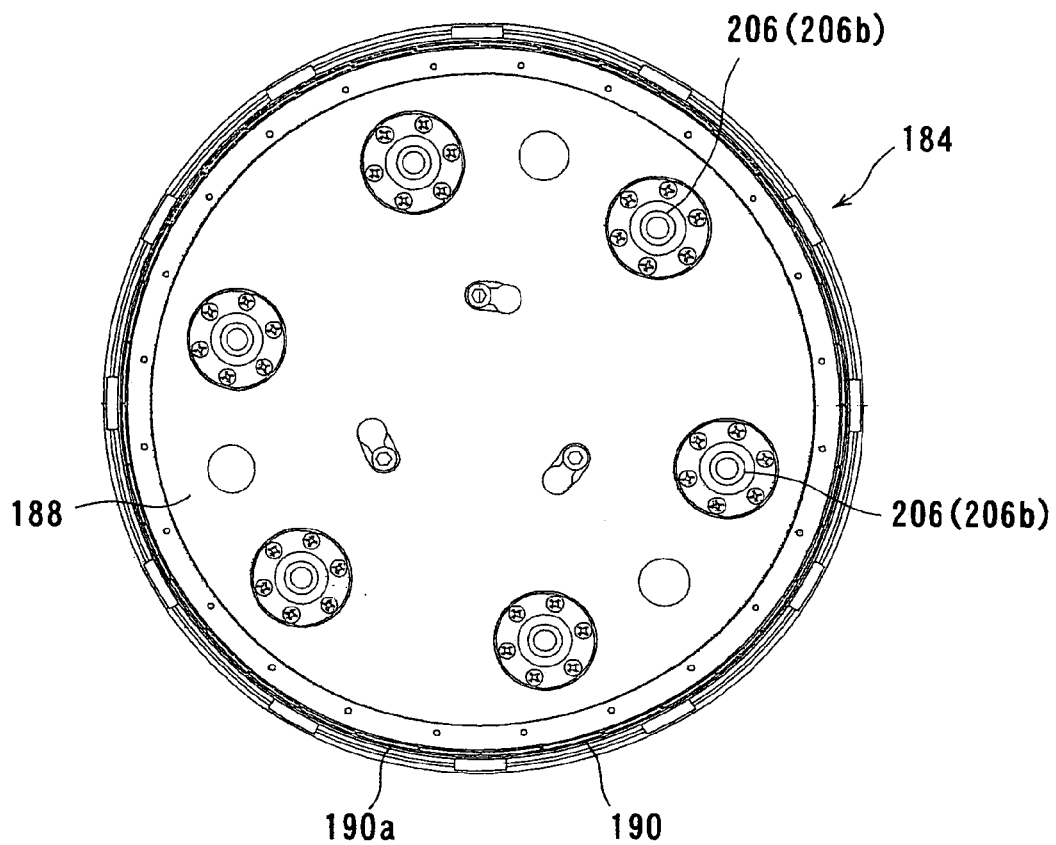
FIG. 19 is a bottom view of a plating head.

The cover member 188 also includes, in its interior, a plurality of radially extending vacuum/gas supply passages 188*b*. As shown in FIG. 19, a plurality (six in FIG. 19) of pushers 206 arranged along a circumferential direction is provided in a region, surrounded by the annular seal 190, of the lower surface of the cover member 188. Each vacuum/gas supply passage 188*b* is selectively connected, via a joint 208 provided in the cover member 188, to one of a vacuum line 210 extending from a vacuum source 194 and a gas supply line 214 extending from a gas supply source 212, and communicates with a backside of each pusher 206. An auxiliary substrate release mechanism 216 for releasing a substrate W attracted and held by the annular seal 190 is thus constructed.

Figure 18:
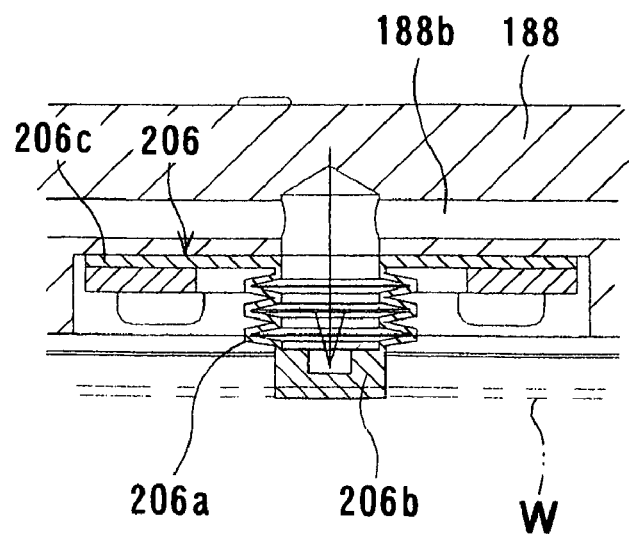
FIG. 18 is an enlarged sectional view showing a pusher of the substrate holding apparatus shown in FIG. 16.

In particular, as shown in detail in FIG. 18, the pusher 206, formed of a flexible elastic material such as a synthetic rubber, e.g. a fluorocarbon resin, includes a hollow extensible bellows portion 206*a* opening on the backside, and a columnar top (lower end) pressing portion 206*b*, in its flange portion 206C, is hermetically attached to the lower surface of the cover member 188. A lower surface of the pressing portion 206*b* lies slightly lower than the lower surface of the annular seal 190. When holding substrate W by the annular seal 190, an interior of the vacuum/gas supply passage 188*b* is vacuumed through the vacuum line 210 so as to contract the bellows portion 206*a*, thereby lifting the pressing portion 206*b* to an upper position at which it does not impede holding of the substrate W. When releasing the substrate W held by the annular seal 190, a gas is introduced through the gas supply line 214 into the vacuum/gas supply passage 188*b* so as to expand the bellows portion 206*a*, thereby lowering the pressing portion 206*b* so that it presses on the substrate W downwardly.

By thus providing for the auxiliary release mechanism 216, according to necessity, a substrate W can be securely released from the annular seal 190 by utilizing pressure of the pusher 206 even when the substrate W is strongly sticking to the lower surface of the annular seal 190.

Figure 20:
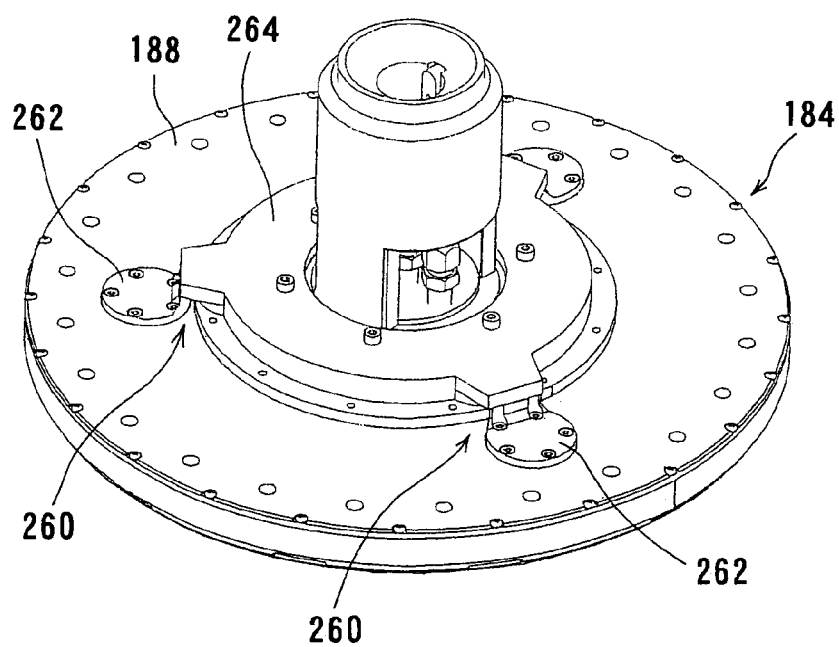
FIG. 20 is a perspective view of the plating head.
Figure 21:
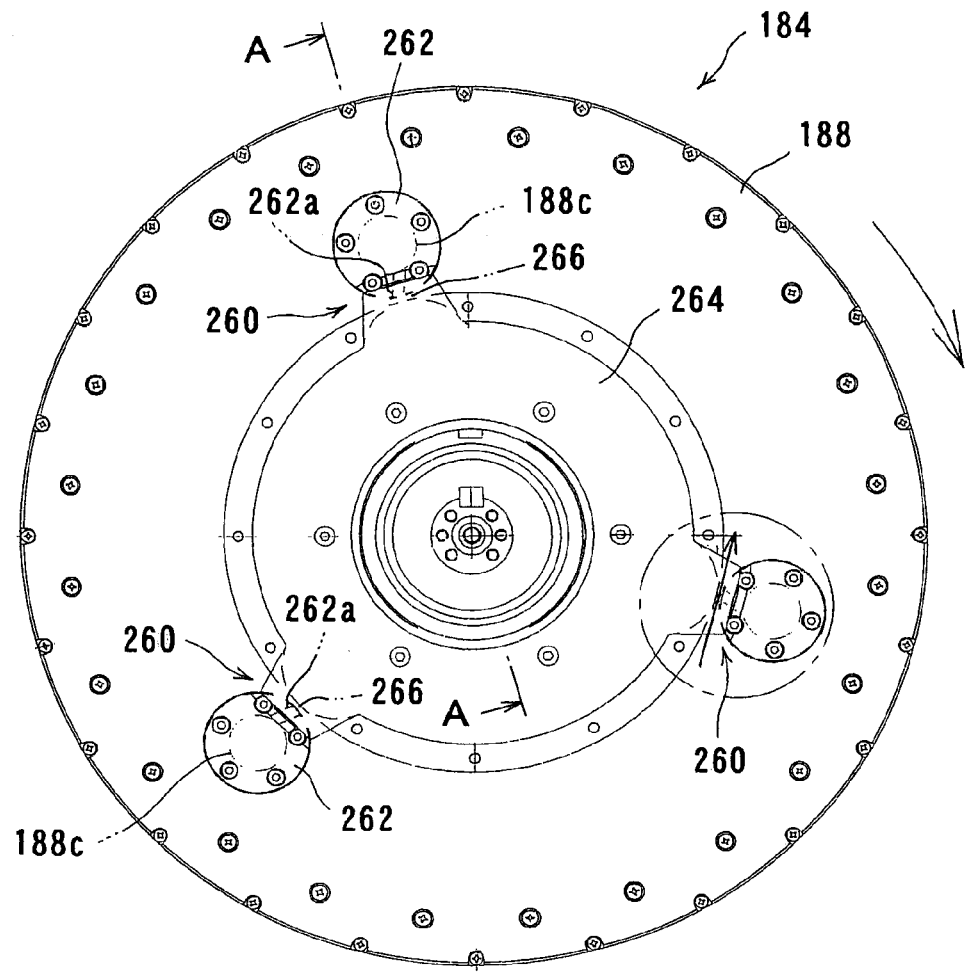
FIG. 21 is a plan view of the plating head.
Figure 22:
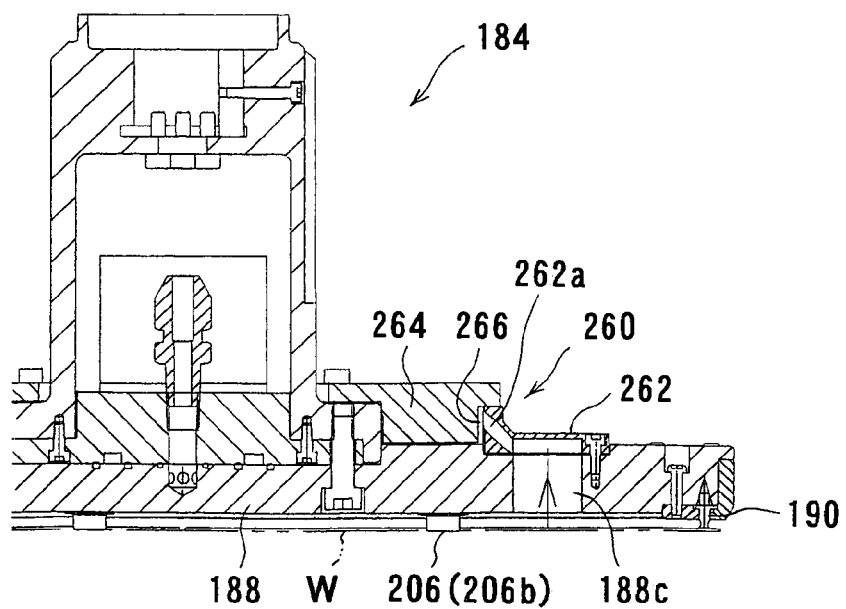
FIG. 22 is a cross-sectional view taken along line A-A of FIG. 21.

Further, according to this embodiment, as shown in FIGS. 20 through 22, the plating head 184 is provided with a plurality (three in these Figures) of throttling mechanisms 260. Each throttling mechanism 260 is designed to create a negative pressure on a back surface side of a substrate W, sealed with the annular seal 190, i.e. in a space defined by the back surface of the substrate W, the cover member 188 and the annular seal 190, through rotation of the plating head 184 holding the substrate W.

The throttling mechanism 260 includes an air vent hole 188*c*, provided in the cover member 188, for releasing air from the space defined by the back surface of a substrate W held by the annular seal 190, the cover member 188 and the annular seal 190, a lid member 262 covering a top of the air vent hole 188*c*, and an operating plate 264 fixed concentrically on the plating head 184. As shown in FIGS. 21 and 22, a throat portion 266 is formed between each lid member 262 and the operating plate 264, where they are close to each other with a minimum cross-sectional area of passage. When the plating head 184 is rotated, an airflow passing through the throat portion 266 is created, as shown by the arrow in FIG. 21, and velocity of the airflow increases in proportion to a rotational speed of the plating head 184.

On the other hand, the lid member 262 covering the top of the air vent hole 188*c* has an air flow passage 262*a* communicating at one end with the air vent hole 188 and communicating at another end with the throat portion 266, so that the throttling mechanism creates a negative pressure in the air vent hole 188*c* and on the back surface side of the substrate W by utilizing a venturi effect.

In particular, when an airflow passing through the throat portion 266 is created by rotation of the plating head 184, as described above, because of the airflow, air in the air vent hole 188*c* is discharged through the air flow passage 262*a* to outside, whereby a negative pressure is created in the air vent hole 188*c* and on the back surface side of the substrate W. A degree of the negative pressure is proportional to a rotational speed of the plating head 184.

A negative pressure, thus created on the back surface side of a substrate W sealed with the annular seal 190, i.e. in the space defined by the back surface of the substrate W, the cover member 188 and the annular seal 190, by the throttling mechanism 260 through the rotation of the plating head 184, can act as a holding force on the substrate W. This can ensure a sufficient holding force on a substrate without resorting to an increased attracting or mechanical holding force. A number of throttling mechanisms 260 provided in the plating head 184 may be determined according to a necessary holding force.

Further, by increasing the velocity of the airflow created in the throat portion 266 of the throttling mechanism 260 in proportion to the rotational speed of the plating head 184 to thereby lower the internal pressure of air vent hole 188a by utilizing a venturi effect, a holding force on a substrate W as produced by the throttling mechanism 260 can be enhanced in proportion to the rotational speed of the plating head 184.

Operation of the substrate holding apparatus 180 will now be described.

First, as shown in FIG. 16, the substrate support 182 is moved to a lowermost position (substrate transfer position) without rotating the plating head 184, and a substrate W, attracted by a robot hand (not shown), is inserted into the substrate holder 72. Attraction of the robot hand is released to thereby place the substrate W on the substrate rest portion 185 of the substrate support 182. At this point of time, a front surface (processing surface) of the substrate W faces downward. Thereafter, the robot hand is withdrawn from the substrate holder 72. Next, the substrate support 182 is raised so as to bring a lower end surface of the annular seal 190 into tight contact with a peripheral portion of a back surface (upper surface) of the substrate W.

At this time, the pushers 206 of the auxiliary release mechanism 216 are held in a raised position so as not to impede holding of the substrate W.

Thereafter, the interior of the circumferential groove 190a of the annular seal 190 is vacuumed by the substrate holding mechanism 202, thereby attracting the peripheral portion of the back surface of the substrate W to the annular seal 190 to hold the substrate W. An attracting force is generated only within the circumferential groove 190a inside a contact portion of the annular seal 190 in contact with the substrate W. That portion of the back surface of the substrate W, which is surrounded by the annular seal 190, is thus shut off from the front surface (processing surface) of the substrate W by sealing of the annular seal 190.

According to this embodiment, the peripheral portion of the substrate W is attracted by the ring-shaped annular seal 190 having a small width (in a radial direction), thereby minimizing attraction width and eliminating adverse influence (such as deflection) on the substrate W. In particular, the annular seal 190, having a very small width, contacts a peripheral portion of the substrate W, lying e.g. within a 5 mm-width region from a periphery of the substrate. Since the annular seal 190 contacts only such a narrow peripheral portion of the back surface of the substrate W, there is little fear of escape of heat of a processing liquid through a surface of the annular seal 190 in contact with the substrate W during processing.

When performing, for example, immersion processing of a substrate W held by the substrate holder 72, as with the above-described substrate holder 72 provided in the electroless plating unit 26, the substrate support 182 is slightly lowered (e.g. several mm) to detach the substrate W from the substrate rest portion 185. Thereafter, the substrate holding apparatus 180 in its entirety is lowered to immerse the substrate W in a not-shown processing liquid, such as a plating solution and, according to necessity, the plating head 184 is rotated together with the substrate W to perform processing of the substrate. Since only the back surface of the substrate W is attracted and held, an entire front surface and also an edge portion of the substrate W can be immersed in the processing liquid and can be processed.

Further, since the substrate support 182 has been lowered and is separated from the substrate W, and only the back surface of the substrate W is attracted and held, flow of processing liquid is not impeded by immersion of substrate W and a uniform flow of processing liquid is created over the entire front surface of the substrate W. With the flow of processing liquid, gas bubbles caught on the front surface of the substrate W or gas bubbles generated during processing can be discharged upwardly from the front surface of the substrate W. A non-uniform flow of processing liquid as well as gas bubbles, which may adversely affect processing, such as plating, can thus be prevented or eliminated, thereby enabling uniform processing, such as plating, over the entire front surface, including an edge, of the substrate W. Furthermore, since an inner side of a ring-shaped vacuum-attracted portion of the back surface of the substrate W is shut off from the front surface by the sealing of the annular seal 190, the processing liquid can be prevented from intruding into the inner side of the annular seal 190 on the back surface of the substrate W.

When subsequently performing rinsing (cleaning) of the substrate W with e.g. pure water and draining (spin-drying) after rinsing, the entire substrate holding apparatus 180 is raised to pull the substrate W up from the processing liquid and, while rotating the plating head 184 together with the substrate W, pure water is sprayed toward the substrate W, followed by draining of pure water (spin-drying) by rotating the plating head 184 together with the substrate W at a high speed.

During the above operation, the substrate W is held by an attracting force generated by vacuuming of the interior of the circumferential groove 190a of the annular seal 190 and, in addition, by a holding force of a negative pressure created on the back surface side of the substrate W by the throttling mechanism 260. The holding force provided by the throttling mechanism 260 is proportional to the rotational speed of the plating head 184. Accordingly, even when the attracting force generated by vacuuming of the interior of the circumferential groove 190a of the annular seal 190 is weakened, a sufficient holding force on a substrate can be ensured during the above operation to prevent falling of the substrate.

It is noted in this regard that an attracting force generated by vacuuming of the interior of the circumferential groove 190a of the annular seal 190 has conventionally been set generally at such a level as to securely prevent fall of a substrate even when the substrate is rotated at a high speed. According to this embodiment, by utilizing the holding force provided by the throttling mechanism 260, a sufficient holding force on a substrate can be obtained even when the attracting force is weakened without resorting to a strong attracting or mechanical holding force on the substrate.

After completion of this series of processings, the substrate support 182 is raised to place the substrate W on the substrate rest portion 185. Pure water is introduced into the interior of the circumferential groove 190a of the annular seal 190 and jetted toward the substrate W by the substrate release mechanism 204 while a gas is introduced into a back side of each pusher 206 by the auxiliary substrate release mechanism 216 to pressurize an interior of the pusher 206, thereby forcing the pressing portion 206b to protrude downwardly and press on the back surface of the substrate W. At the same time, the substrate support 182 is lowered to detach the substrate W from the annular seal 190, and is further lowered to a position shown in FIG. 16. The robot hand is then inserted into the substrate holder 72 to withdraw the substrate from the substrate holder 72.

By thus jetting pure water from the circumferential groove 190a of the annular seal 190 toward the substrate W and optionally pressing on the back surface of the substrate W with the pressing portion 206b of each pusher 206, it becomes possible, with a pressing force of pure water introduced into the circumferential groove 190a of the annular seal 190 and with pressure of the pressing portion 206b of each pusher 206 on the back surface of the substrate W optionally applied, to release the substrate W easily and securely from the annular seal 190 even when the substrate W is strongly sticking to the annular seal 190 formed of an elastic material, such as a rubber.

According to the substrate holding apparatus, by releasing a substrate, held by the plating head, using water pressure, the substrate can be securely released from the annular seal even when the substrate is strongly sticking to the annular seal, such as a rubber, thus enabling smooth detachment of the substrate from the annular seal. Further, sole use of water pressure for release of the substrate can eliminate a need for a circuit for clean gas introduction, thus simplifying a circuit structure and downsizing the apparatus.

In addition, the throttling mechanism can provide a holding force on a substrate, which ensures holding of a substrate without resorting to a strong attracting or mechanical holding force on the substrate. This can prevent a local deformation of the substrate, and can also prevent the substrate from strongly sticking to an attracting seal and making release of the substrate difficult.

Figure 1:
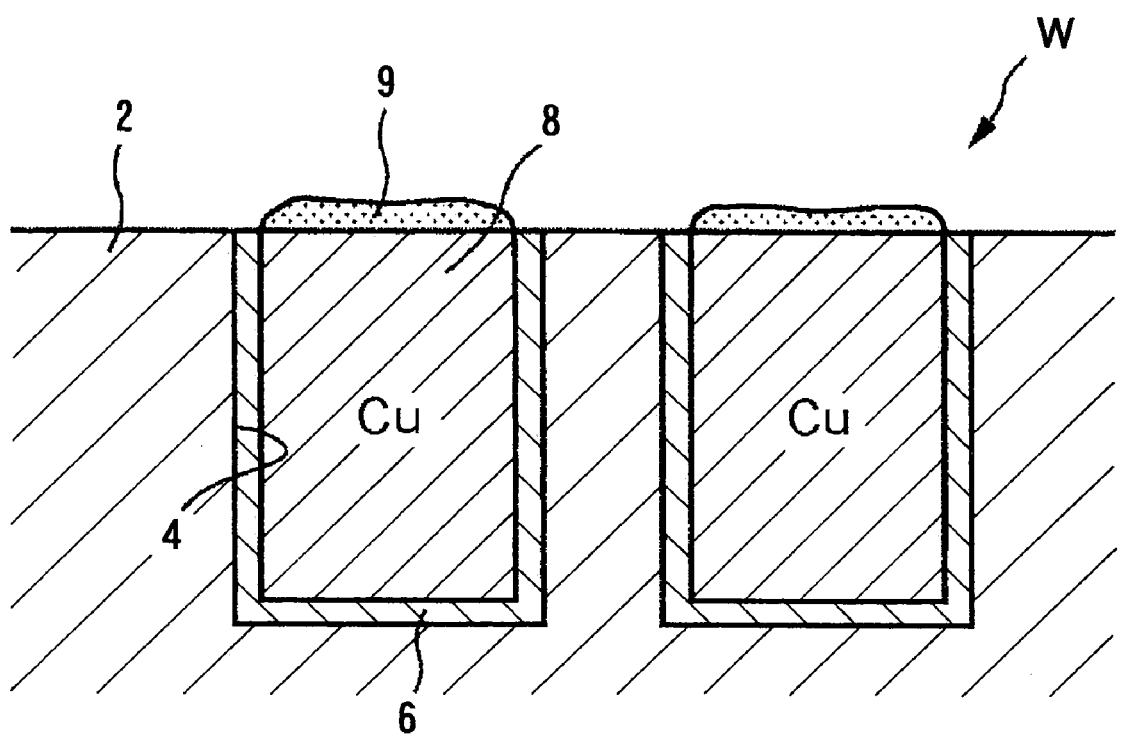
FIG. 1 is a cross-sectional diagram illustrating a protective film as formed by electroless plating.

A description will now be given of a series of electroless plating processings as performed by the electroless plating apparatus (substrate processing apparatus). The following description illustrates a case of selectively forming a protective film (cap material) 9 of a CoWP alloy film to protect interconnects 8, as shown in FIG. 1.

First, one substrate W having interconnects 8 formed in a surface (see FIG. 1) is taken by the first transport robot 14 out of the transport box 10 housing such substrates W with their front surfaces facing upwardly (face up), and the substrate W is transported to the dry substrate storage section 50 of the temporary stage 16 and the substrate W is held in the dry substrate storage section 50. The substrate W held in the dry substrate storage section 50 is transported by the second transport robot 18 to the pre-plating processing unit 24. The substrate is reversed from face-up to face-down by the first transport robot 14 or the second transport robot 18.

In the pre-plating processing unit 24, the substrate W is held face down by the substrate holder 72, and is first subjected to pre-cleaning of the front surface of the substrate W. In particular, as shown in FIG. 8, the top opening of the cell 74 is covered with the cell cover 76, and then the substrate holder 72 holding the substrate W is lowered to a predetermined position (first processing position) above the cell cover 76. A pre-cleaning solution, which is an acid solution such as $H_2SO_4$, is sprayed from the chemical solution spray nozzles 116 of the cell cover 76 toward the substrate W to remove CMP residue, and the like, such as copper remaining on an insulating film 2 (see FIG. 1). Thereafter, pure water is sprayed from the pure water spray nozzles 118 of the cell cover 76 toward the substrate W to clean (rinse) the substrate W.

Next, as shown in FIG. 9, the cell cover 76 is retreated to a retreat position beside the cell 74 to open the top opening of the cell 74, and the substrate holder 72 holding the substrate W is lowered to a predetermined position (second processing position) above the chemical processing section 84. A catalyst application solution, such as a mixed solution of $PdCl_2$ and $H_2SO_4$, is sprayed from the chemical solution spray nozzles 86 of the chemical processing section 84 toward the substrate W to attach Pd as a catalyst to surfaces of interconnects 8. Thus, Pd seeds as catalyst seeds are formed on the surfaces of interconnects 8 to activate exposed surfaces of interconnects 8.

Next, after raising the substrate holder 72 holding the substrate W to the predetermined position (first processing position), the top opening of the cell 74 is covered with the cell cover 76. Pure water is then sprayed from the pure water spray nozzles 118 of the cell cover 76 toward the substrate W to clean (rinse) the substrate W.

The second substrate transport robot 18 receives the substrate W after this pre-plating processing from the substrate holder 72 of the pre-plating processing unit 24 and transfers the substrate W to the substrate holder 72 of the electroless plating unit 26.

In the electroless plating unit 26, the substrate W is held face down by the substrate holder 72, and is first subjected to chemical processing of the front surface. In particular, as shown in FIG. 10, the top opening of the cell 74 is covered with the cell cover 76, and then the substrate holder 72 holding the substrate W is lowered to a predetermined position (first processing position) above the cell cover 76. A post-catalyst application processing solution, for example, a solution of sodium citrate, is sprayed from the chemical solution spray nozzles 116 of the cell cover 76 toward the substrate W to perform neutralization processing of the surfaces of interconnects 8. Thereafter, pure water is sprayed from the pure water spray nozzles 118 of the cell cover 76 toward the substrate W to clean (rinse) the substrate W.

Next, as shown in FIG. 11, the cell cover 76 is retreated to a retreat position beside the cell 74 to open the top opening of the cell 74, and the substrate holder 72 holding the substrate W is lowered to immerse the substrate W in a chemical solution (plating solution) in the bath 122, thereby performing electroless plating (electroless CoWP cap plating) of the surface of the substrate W. In particular, the substrate W is immersed in a CoWP-plating solution, for example at 80° C. for about 120 seconds, to perform selective electroless plating (electroless CoWP cap plating) of activated surfaces of interconnects 8.

After pulling the substrate W up from a liquid surface of the chemical solution, pure water is sprayed from the pure water spray nozzles 128 toward the substrate W, thereby replacing the chemical solution on the surface of the substrate W with pure water and stopping electroless plating.

Next, after raising the substrate holder 72 holding the substrate W to the predetermined position (first processing position), the top opening of the cell 74 is covered with the cell cover 76. Pure water is then sprayed from the pure water spray nozzles 118 of the cell cover 76 toward the substrate W to clean (rinse) the substrate W. A protective film 9 (see FIG. 1) of a CoWP alloy film is thus formed selectively on the surfaces of interconnects 8 to protect interconnects 8.

Next, the substrate W after this electroless plating processing is transported by the second substrate transport robot 18 to the post-plating processing unit 22, for example, composed of a roll-cleaning unit where post-plating processing is performed by rubbing the substrate W with a roll brush to remove particles and unnecessary matter from the surface of the substrate W. During transportation to the post-plating processing unit 22, the substrate is reversed from face-down to face-up. After the post-plating processing, the substrate W is transported by the second substrate transport robot 18 to the wet substrate storage section 52 of the temporary stage 16 and the substrate W is held in the wet substrate storage section 52. During storage, pure water is sprayed from the spray nozzle 62 toward the substrate W to prevent drying of the substrate W.

The first substrate transport robot 14 takes the substrate W out of the wet substrate storage section 52 of the temporary stage 16, and transports the substrate W to the cleaning/drying unit 20, for example, composed of a spin-drying unit where chemical cleaning and pure water cleaning of the surface of the substrate W are performed, followed by spin-drying. The substrate W after spin-drying is returned by the first transport robot 14 to the transport box 10.

Though use of a CoWB alloy for the protective film 9 has been described, it is also possible to form a protective film 9 of a CoB, NiB or NiWB alloy. Further, instead of using copper as an interconnect material, it is also possible to use a copper alloy, silver or a silver alloy, gold or a gold alloy, and the like.

According to the present invention, different processings with different processing liquids can be performed by a single substrate processing unit while preventing mixing of the processing liquids. This can result in a reduction in a space for performing an entire substrate processing process and a reduction in energy necessary for substrate transportation.

What is claimed is:

1. A substrate processing unit comprising:
   a vertically-movable substrate holder for holding a substrate;
   a pan surrounding a periphery of said substrate holder;
   a cell, located below said substrate holder and within said pan, with a chemical processing section being in said cell;
   a cell cover, capable of closing a top opening of said cell, having spray nozzles positioned above an upper surface of said cell cover for separately spraying at least two types of processing liquids toward the substrate when held by said substrate holder,
   wherein said pan and said cell each have an individual liquid discharge line; and
   a pure water spray nozzle, for spraying pure water toward the substrate after chemical processing and while the substrate is held by said substrate holder, within said cell.

2. The substrate processing unit according to claim 1, wherein one of the at least two types of processing liquids is pure water.

3. The substrate processing unit according to claim 1, wherein said chemical processing section is for performing chemical processing of the substrate, when held by said substrate holder, by performing spray processing.

4. The substrate processing unit according to claim 1, wherein said chemical processing section is for performing chemical processing of the substrate, when held by said substrate holder, by performing immersion processing.

5. The substrate processing unit according to claim 1, further comprising:
   a chemical solution supply line for supplying a chemical solution to said chemical processing section and circulating the chemical solution; and
   a mechanism for controlling at least one of concentration, temperature and flow rate of the chemical solution to be supplied to said chemical processing section.

\* \* \* \* \*